United States Patent [19]

Kushiyama et al.

[11] Patent Number: 5,377,152

[45] Date of Patent: Dec. 27, 1994

[54] SEMICONDUCTOR MEMORY AND SCREENING TEST METHOD THEREOF

[75] Inventors: Natsuki Kushiyama, Yokohama; Tohru Furuyama, Tokyo; Kenji Numata, Yamato, all of Japan

[73] Assignee: Kabushiki Kaisha Toshiba, Kawasaki, Japan

[21] Appl. No.: 978,883

[22] Filed: Nov. 19, 1992

[30] Foreign Application Priority Data

Nov. 20, 1991 [JP] Japan ................................. 3-304335
Nov. 20, 1991 [JP] Japan ................................. 3-304343

[51] Int. Cl.$^5$ ............................................. G11C 7/00
[52] U.S. Cl. ................................ 365/210; 365/149; 365/206; 365/189.09
[58] Field of Search .............. 365/210, 149, 189, 07, 365/206, 201, 189.09; 371/10.1

[56] References Cited

U.S. PATENT DOCUMENTS 4,853,897  8/1989  Nogami et al. .................... 365/210
4,907,200  3/1990  Ikawa et al. ....................... 365/210
5,255,235 10/1993  Miyatake ............................ 365/149

Primary Examiner—Eugene R. LaRoche
Assistant Examiner—Vu Le
Attorney, Agent, or Firm—Banner, Birch, McKie & Beckett

[57] ABSTRACT

A semiconductor memory comprises a dynamic type memory cell array arranged to form a matrix and provided with word lines commonly connected to memory cells of respective columns and bit lines commonly connected to memory cells of respective rows, a dummy cell section having a first set of dummy word lines connected to respective complimentary bit line pairs of said memory cell array by way of respective first capacitances and a second set of dummy word lines connected to respective complementary bit line pairs of said memory cell array by way of respective second capacitances, a dummy word line potential control circuit capable of optionally controlling the mode of driving selected dummy word lines when said word lines of said memory cell array are activated and sense amplifiers connected to the respective complementary bit line pairs of said memory cell array for reading data from selected memory cells of the memory cell array onto the related bit line.

29 Claims, 18 Drawing Sheets

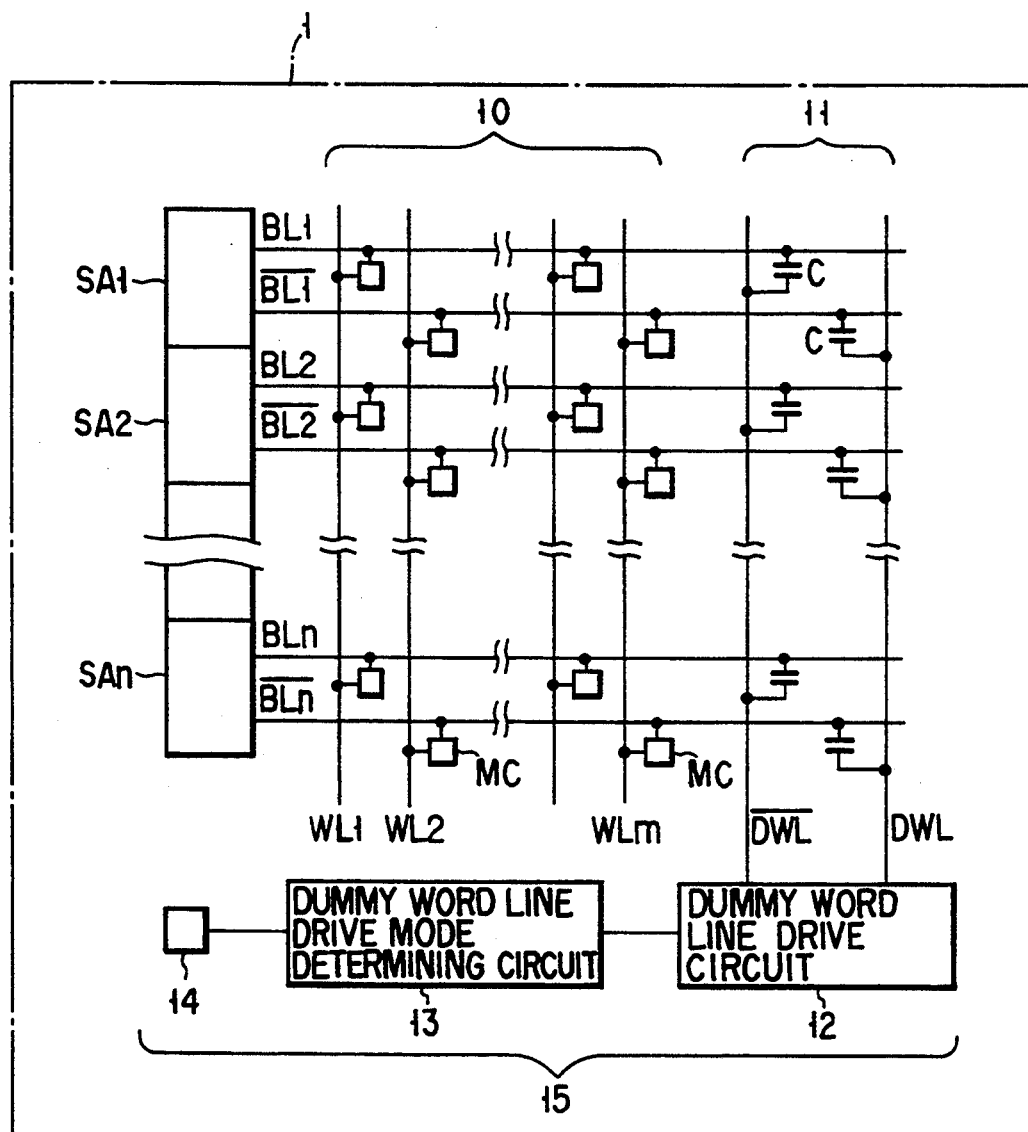
F I G. 6

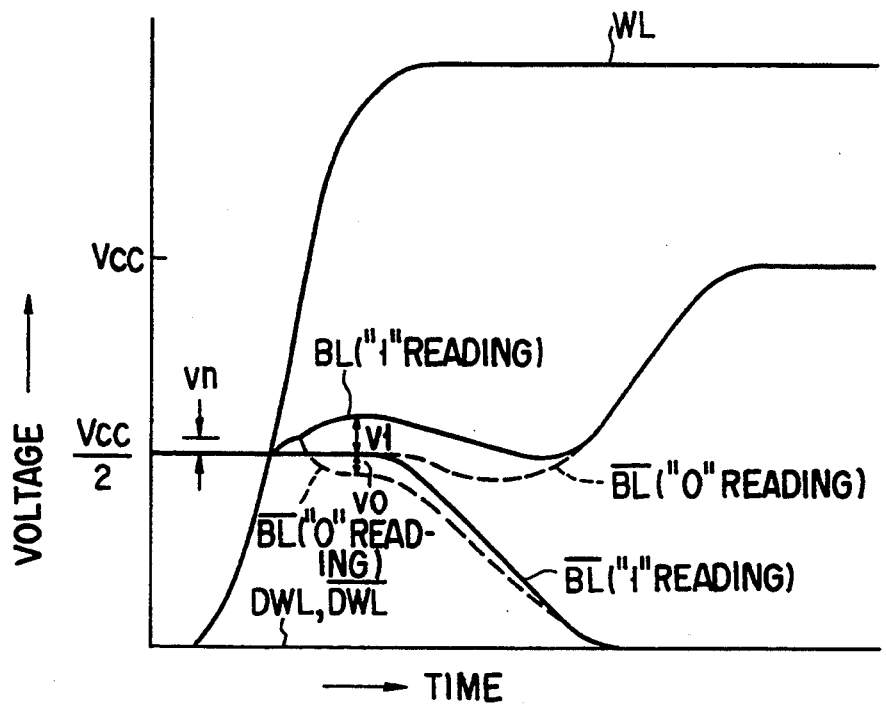
F I G. 7
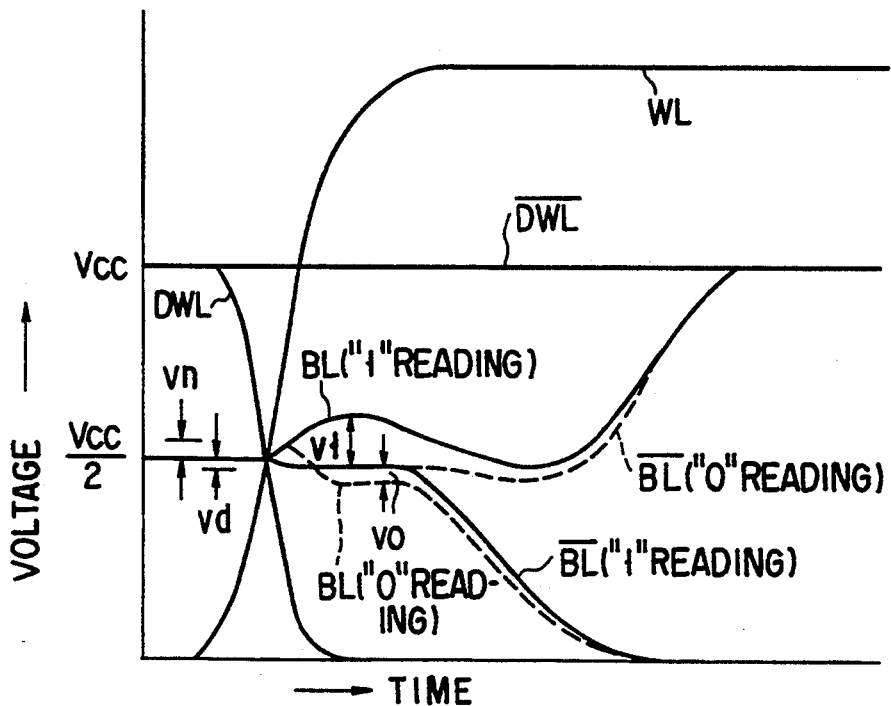
F I G. 8

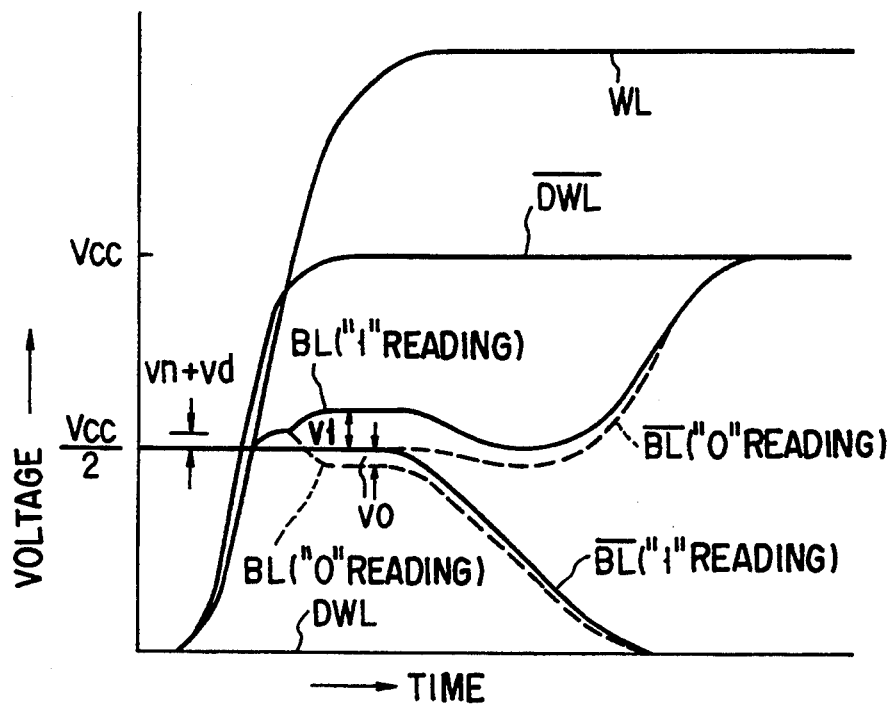
F I G. 9
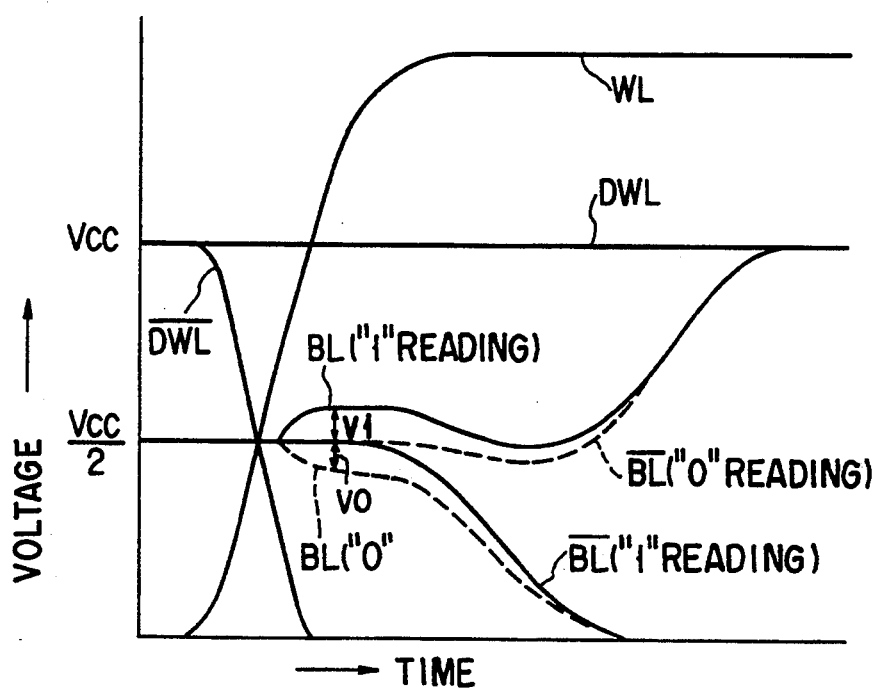
F I G. 10

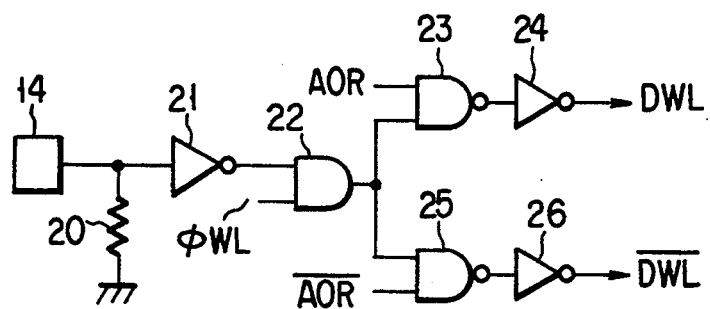
F I G. 12
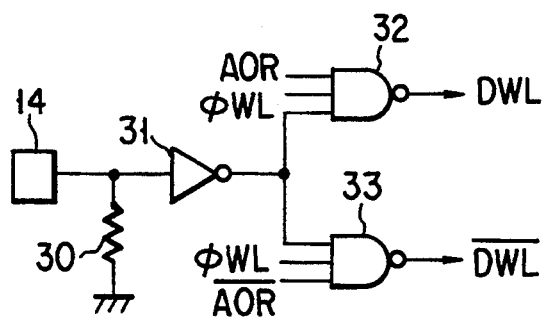
F I G. 13
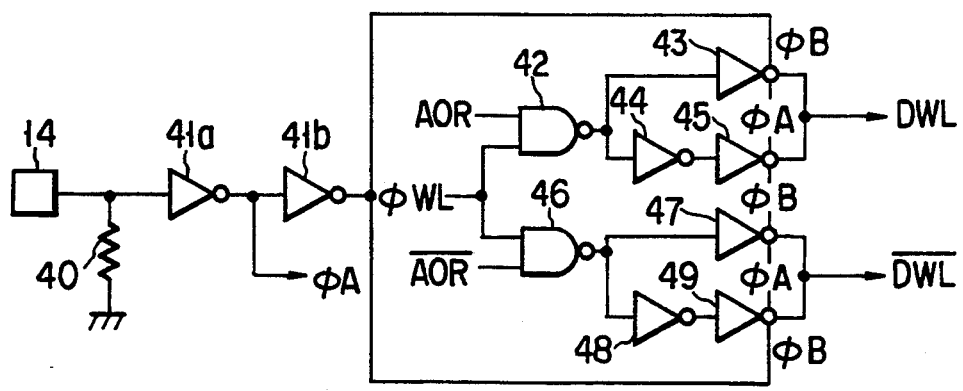
F I G. 14

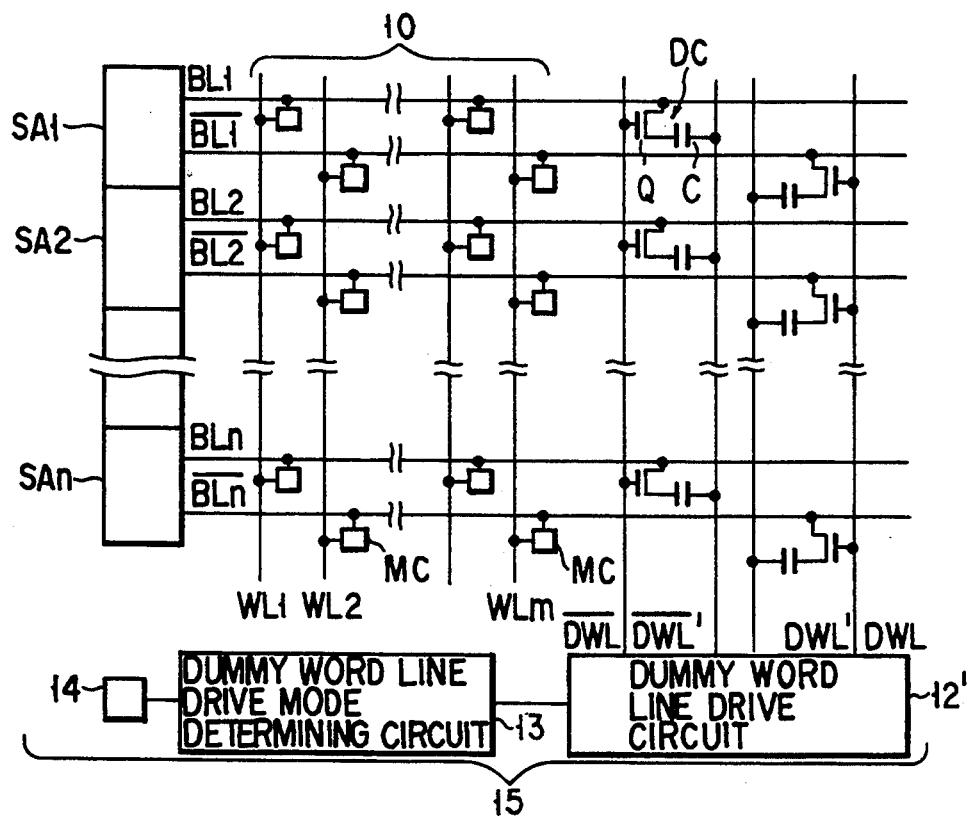
F I G. 17
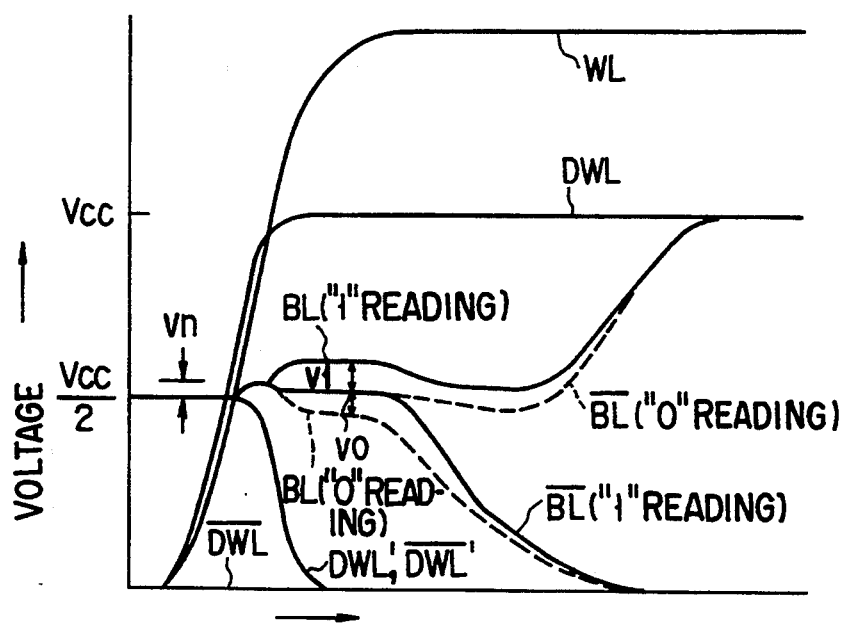
F I G. 18

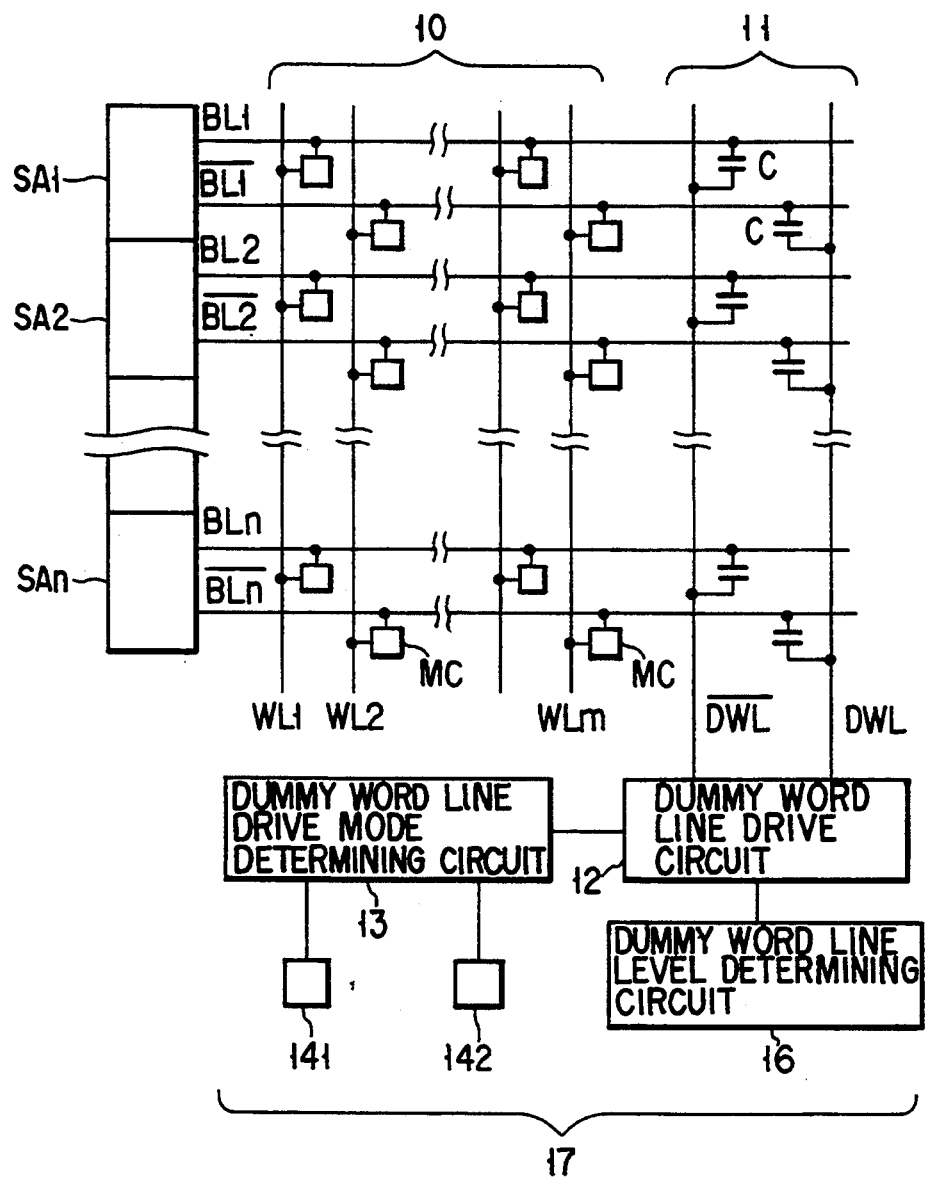
F I G. 19

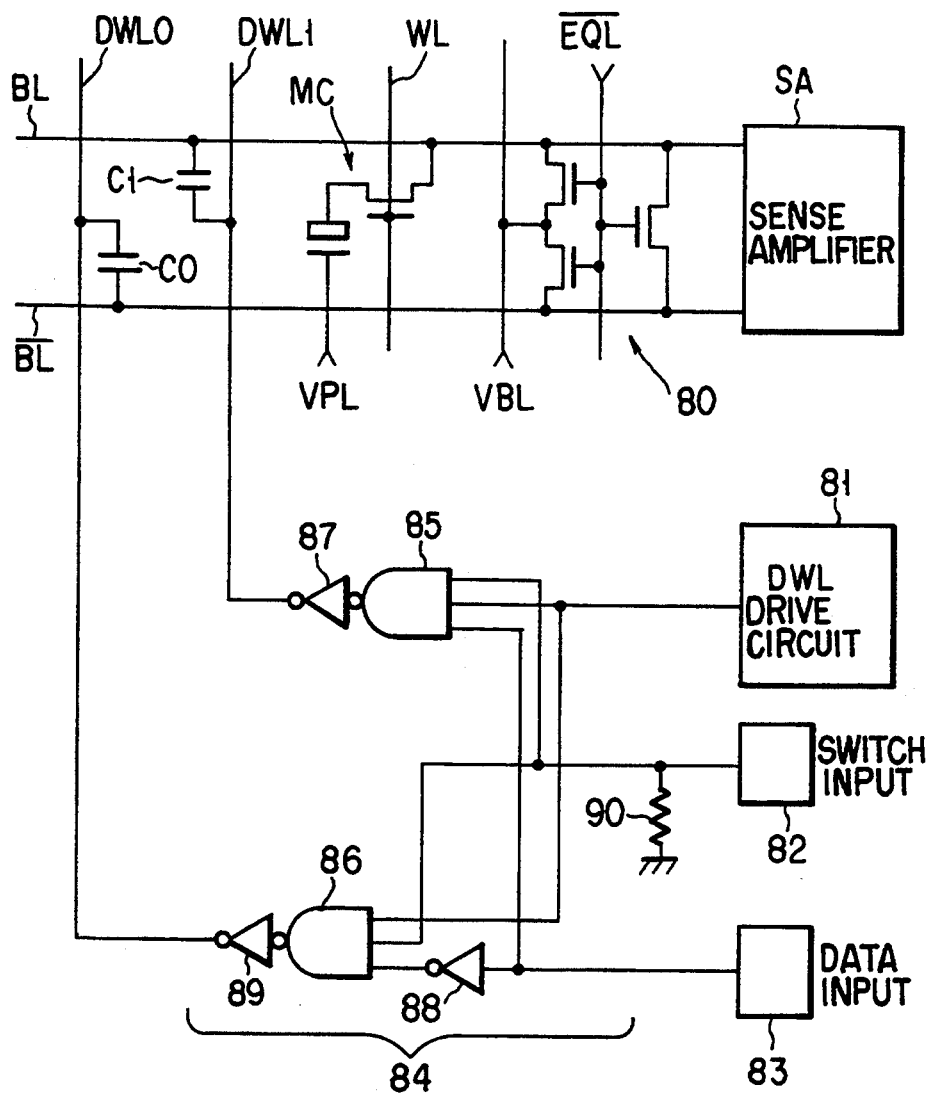
F I G. 22
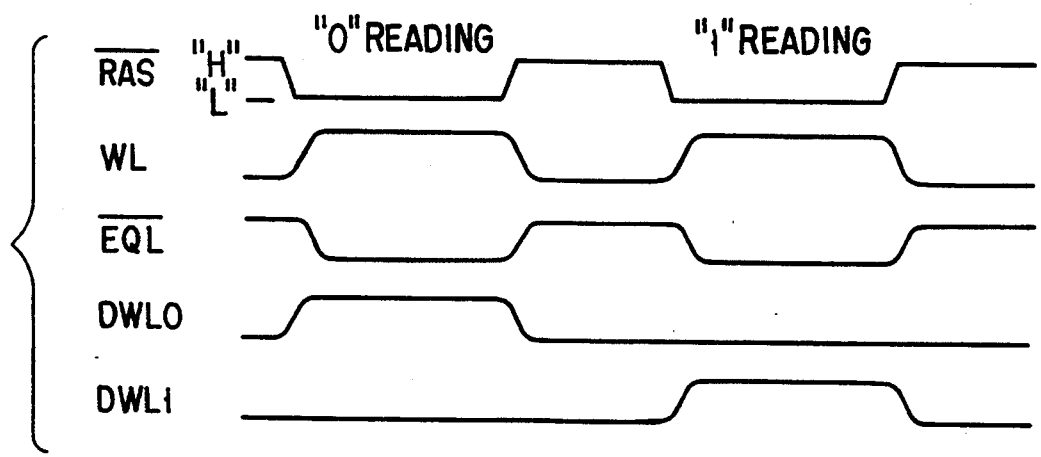
F I G. 23

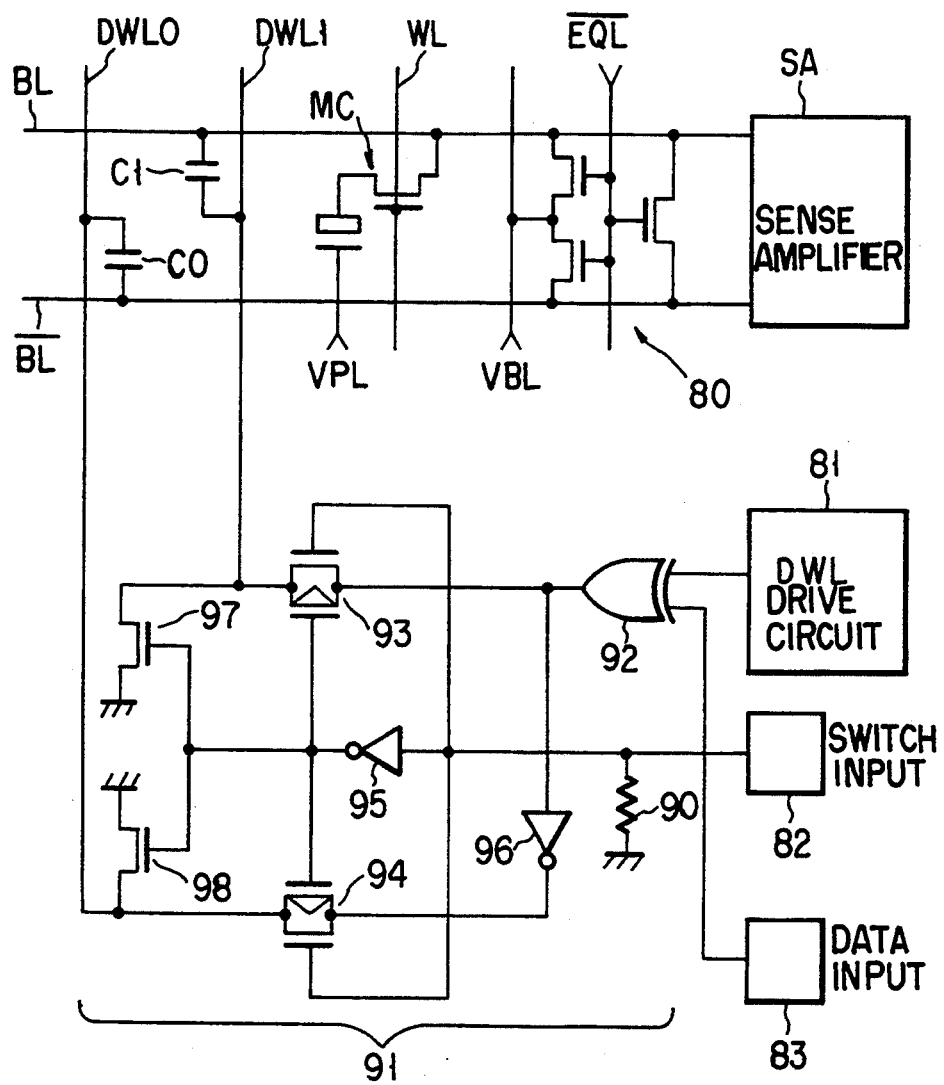
F I G. 24
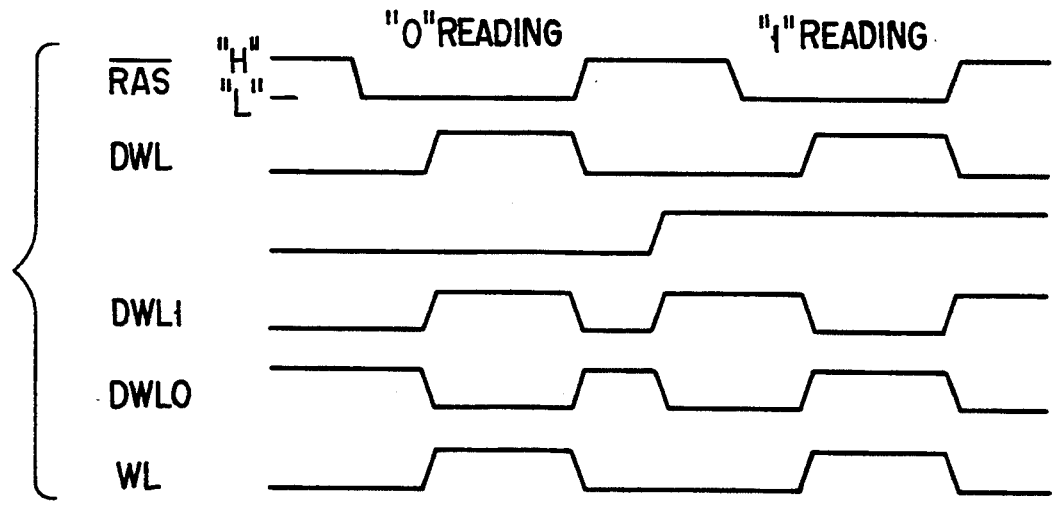
F I G. 25

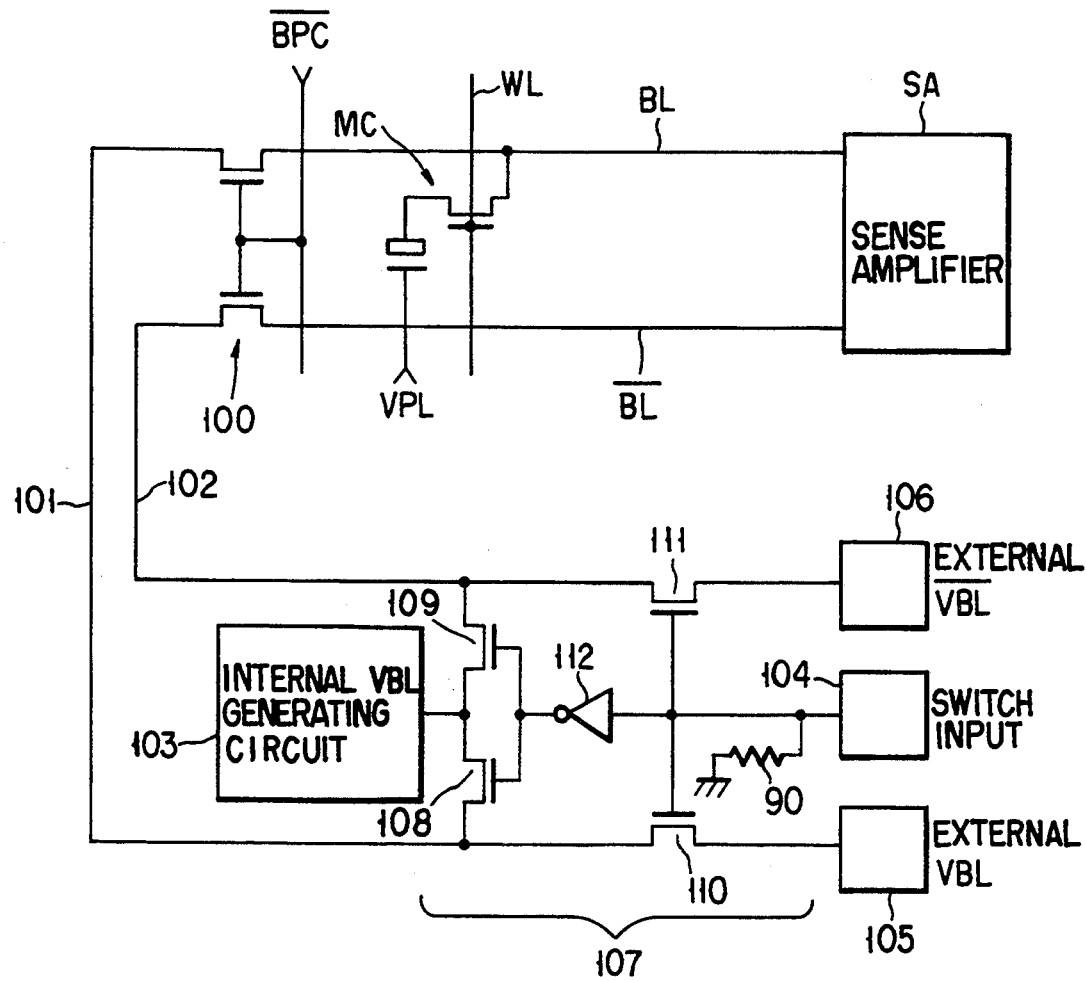
F I G. 26
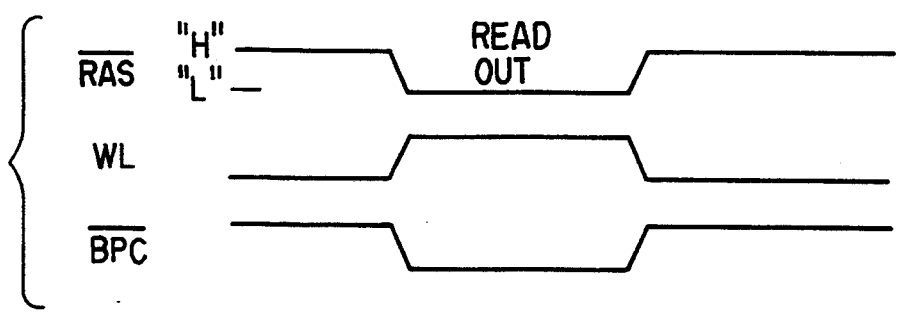
F I G. 27

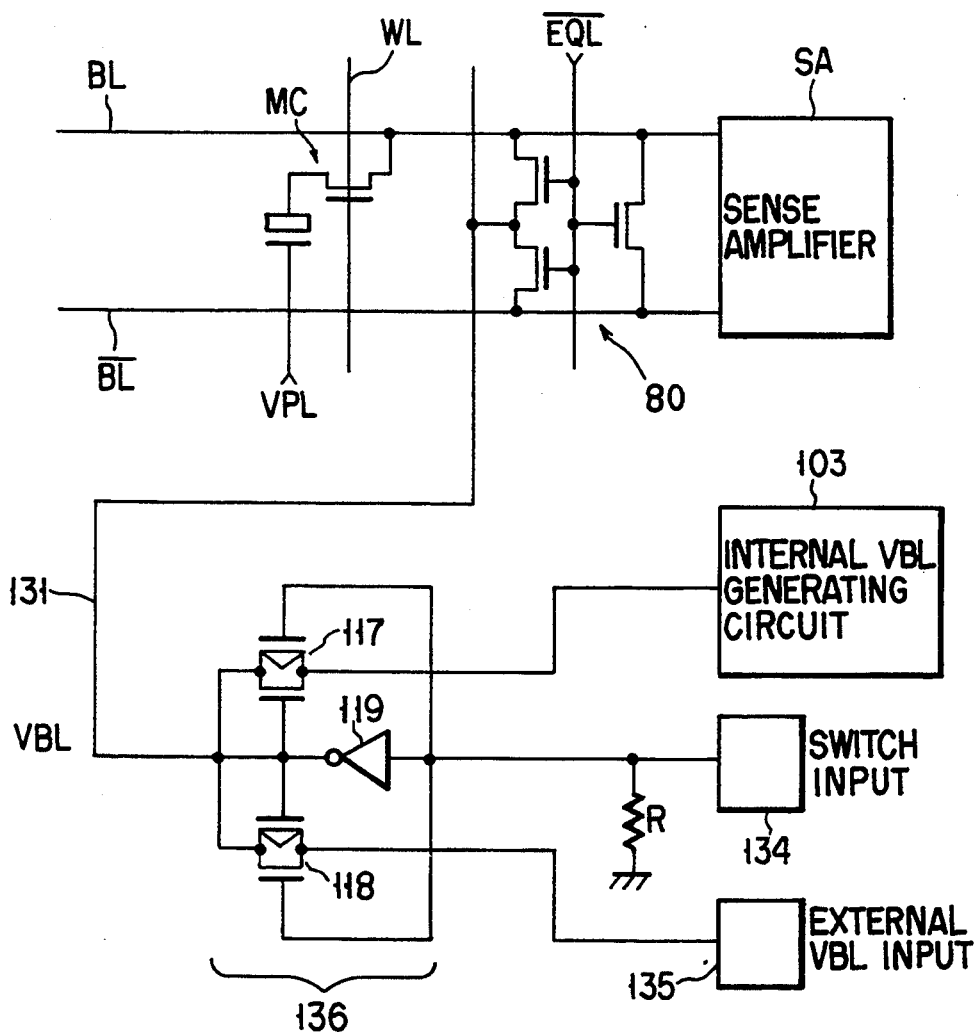
F I G. 30
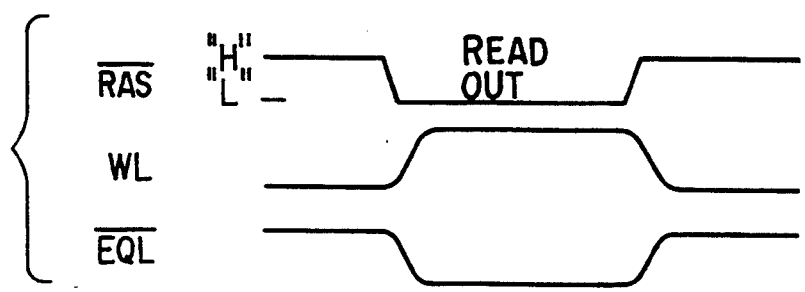
F I G. 31

SEMICONDUCTOR MEMORY AND SCREENING TEST METHOD THEREOF

BACKGROUND OF THE INVENTION

1. Field of the Invention

This invention relates to a semiconductor memory and a method for conducting a screening test on semiconductor memories. In particular, the present invention relates to means for controlling the operation of reading out data from memory cells as well as to a method for conducting a screening test for detecting defective memory cells of semiconductor memories in the state of wafers.

2. Description of the Related Art

Although the process of manufacturing semiconductor memories is normally held under rigorous control, certain variances are inevitably observed in the quality of manufactured memories, variances, if slight, produced in each manufacturing step are added up until the end of the course of processing wafers and the accumulated variances end up as varied performances of the memory cells contained in the manufactured semiconductor memories.

FIG. 1 of the accompanying drawings shows a frequency curve of variances in the performance of the memory cells contained in the samples of semiconductor memories which were tested after the completion of wafer processing steps.

As seen from FIG. 1, the samples could be divided into three groups. Group (1) represents sound memory cells while group (2) and group (3) respectively represent totally defective memory cells where no data can be written nor read and those that operate only imperfectly although they afford data reading and writing.

Manufacturers of semiconductor memories normally conduct a screening test on wafers to sort out defective ones for the first time in the entire manufacturing process at a test step (so called die sort test step) that comes after the completion of wafer processing steps. In the die sort test step, the tip of the needle of the probe card is brought to contact with the pad of the memory chip formed on each wafer in order to provide the chip with electric power, addresses, input data, control signals and other signals necessary for the chip to operate. Then, the wafer is judged for good or bad by measuring the electric current flowing into the needle and the output data and other data coming from the chip and comparing them with respective reference values.

While the die sort test comprises a number of test items, they are generally grouped into two categories of (1) current test and (2) operation test.

The current test is a test that is carried out first. In this test, the stand-by supply current, the operating supply current and the input pin leakage current will be tested among others for each wafer. When these currents are found within respective specified allowable limits, the chip will be judged as a good one and forwarded to the next test. If it does not meet any of these requirements, however, it is rejected as a defective chip and no further test will be performed on it.

Chips that have passed the current test are then subjected to an operation test. This test is aimed to check if their memory cells afford correct data write-in/read-out operations. The operation test normally comprises a number of test items, including the supply voltage, the voltage and timing of input data, the voltage and timing of address data and the data patterns to be written on the memory cells (the combinations of "0"s and "1"s to be written on the memory cell plane), which are combined in many different ways for data write in/read-out operations to see if the data patterns that have been written in the memory cells can be correctly read out.

With a conventional die sort test, memory cells of group (2) can be efficiently removed from the product. On the other hand, however, it is rather difficult to detect and reject memory cells of group (3) because of the small amount of data to be read out of them (including the difference of the potentials of the bit line pair for voltage read out and the difference of the currents of the bit line pair for current read out).

A variety of screening tests have been proposed and tried to reject memory cells of group (3) at the die sort test step. They may include, among others, a test of operating memory cells with a supply voltage lower (or higher) than the limit values defined in the product specification, a test of operating cells with timing which is more rigorous than the timing defined in the product specification for control signals, addresses and other data and a test where data are given to the memory cell plane in the form of various data patterns (the combinations of "0"s and "1"s of adjacent memory cells).

However, any of the known screen tests is not successful in removing memory cells of group (3). Besides, memory cells of group (3) are instable in performance, meaning that they may some times be identified as defective ones while they may be not in other times if a same test is conducted on them for several times.

The memory cells of group (3) that have not been rejected in the die sort test should be detected in the final test that will be conducted after they are packaged. The semiconductor memories that are identified as defective in the final test inevitably entail wastes of packaging materials and the cost of the test which are by no means negligible.

The problem of being unable to perfectly reject memory cells of group (3) can become very significant in the case of dynamic random access memories (DRAMs) having a large memory capacity and a three dimensional structure of stuck type cells or trench type cells because it is difficult to secure a sufficient cell capacity for such memories and consequently the ratio of defective memories to the total turnout can rise if the stuck type cells and the trench type cells respectively involve imperfect contact of storage nodes and defective trench holes.

Now, the configuration and the operation of a typical conventional DRAM will be described by referring to FIGS. 2 through 5 of the accompanying drawings that partly illustrate the DRAM.

FIG. 2 is a circuit diagram illustrating the configuration of part of the memory cell array MCA of a conventional DRAM and the connection between the memory cell array and the sense amplifiers SA1 through SAn.

In the circuit diagram of the memory cell array MCA, MC, MC, . . . denote respective DRAM cells arranged to form a matrix and WL1 through WLm respectively denote word lines commonly connecting the cells MC, MC, . . . of the respective rows of the matrix, while BL1, /BL1 through BLn, /BLn respectively denote bit lines commonly connecting the cells MC, MC, . . . of the respective columns. DCA denotes a dummy cell section and the dummy cells of this section are connected to the respective bit lines BL1, /BL1 through BLn, /BLn on a one by one basis.

In the dummy cell section DCA of the circuit diagram, DWL and /DWL denote dummy word lines, While VPL and VDC respectively denote the dummy cell capacitor plate potential and the dummy cell writing potential.

The sense amplifiers SA1 through SAn are connected to respective complementary bit line pairs (BL1, /BL1) through (BLn, /BLn) to sense amplify the data read out on the bit lines from memory cell of a selected row.

FIG. 3 is a circuit diagram for one of the memory cells of FIG. 2.

In FIG. 3, Q denotes a MOS transistor for a transfer gate, of which the drain is connected to bit line BLi or /BLi and the gate is connected word line WLi. C denotes a capacitance for storing data having one of its terminals connected to the source of the transistor Q and the other terminal connected to the capacitor plate potential VPL.

FIG. 4 is a circuit diagram for one of the sense amplifiers SA1 through SAn.

In FIG. 4, EQ denotes a bit line precharge equalizing circuit and VPR and /φEQ respectively denote the bit line precharge voltage and a precharge equalizing signal. SN and SP respectively denote an N-channel sense amplifier for sensing the bit line potential and a P-channel sense amplifier for restoring the bit line potential, while /φn and φp respectively denote an N-channel sense amplifier activation signal and a P-channel sense amplifier activation signal.

FIG. 5 is a graph showing voltage waveforms of the DRAM of FIG. 2 typically obtained when it operates to read out data.

In FIG. 5, Vcc denotes the supply voltage and Vcc/2 denotes the bit line precharge potential, while WL, DWL and /DWL respectively denote the word line of the selected row, the selected one of the dummy word lines and the other dummy word line that is not selected. BL and /BL respectively denote one of the bit lines connected to the cells of the selected row and the other bit line which is complementary to the former bit line BL (and connected to the dummy cell DC selected by the dummy word line DWL).

Vn denotes the potential attributable to the coupling noise generated on the former bit line BL through the capacitance between the gate and drain of the cell MC of the selected row when the potential of the word line WL of the selected row rises and Vd denote the potential at tributable to the coupling noise generated on the other bit line /BL connected to the dummy cell DC which is selected as a result of the potential rise in the dummy word line DWL. V1 denote the differential in the signal potential that appears when the "1" data of the selected cell MC is read out on the bit line BL while V0 denotes the variation in the signal potential that appears when the "0" data of the selected cell MC is read out on the bit line BL.

As DRAMs are made to have a larger capacity and memory cells are highly miniaturized and integrated to consequently reduce the area that can be spared for cells in each memory device, there arises a remarkable tendency of raised threshold voltage and reduced cell capacitance for "1" data due to the substrate bias effect of the cell transistor, making it difficult to write "1" data in the cell to a sufficient level.

Consequently, the variation $\Delta v1$ in the bit line signal potential at the time of reading out "1" data tends to be smaller than the variation $\Delta v0$ in the bit line signal potential at the time of reading out "0" data. In other words, the "1" data read out margin (or the sense margin of the bit line sense amplifier) and the "0" data read-out margin come to unbalanced to push up the margin soft error rate of the device.

However, a conventional DRAM cannot arbitrarily change the read-out margins of its memory cells for optimization of the margins.

SUMMARY OF THE INVENTION

In view of the above described circumstances, it is therefore an object of the present invention to provide a semiconductor memory that can solve the problem of the difficulty with which any unbalanced condition of the "1" data read-out margin and the "0" data read-out margin of a conventional semiconductor memory is corrected and which becomes increasingly conspicuous as memory cells are more and more miniaturized and integrated.

It is another object of the present invention to provide a method for conducting a screening test on semiconductor memories which is free from the problem of existing similar screening tests of being not able to detect all the defective wafers of the memory cells that operate only imperfectly.

According to the invention, the above first object is achieved by providing a semiconductor memory comprising an array of dynamic type memory cells, sense amplifiers for reading data from selected memory cells of the memory cell array, a dummy cell section having dummy word lines connected to respective complimentary bit line pairs of the memory cell array by way of capacitances and a dummy word line potential control circuit capable of arbitrarily controlling the mode of driving the dummy word lines when the selected word line of the memory cell array is activated.

With a semiconductor memory having a configuration as described above, any unbalanced condition of the "1" and "0" data read-out margins can be corrected without difficulty by controlling the dummy word line potential control circuit.

Therefore, an unbalanced condition of the "1" and "0" data read-out margins of the memory cells of a semiconductor memory according to the invention can be corrected along with that of other memories to which it belongs, whenever required as a result of a soft error test conducted on the semiconductor memory in the course of manufacturing if it is selected as a test specimen from the lot.

Additionally, the dummy word line drive mode to be used for correcting such an unbalanced condition of a semiconductor memory selected as a specimen from a lot can be semi-permanently maintained if the pad formed on the memory chip is connected to a given potential node in such a manner that the dummy word line drive mode can be selectively determined by the potential of the pad. It may be apparent that the reliability and hence the yield rate of the lot are improved by such an arrangement.

According to the invention, the above second object is achieved by providing a method of conducting a screening test on semiconductor memories comprising a step of applying a control signal to a pad formed on the memory chip zone of each semiconductor wafer as data are read out of the memory cells of the memory cell array of the memory circuit of the chip to forcibly reduce the difference of voltages or currents on the selected bits line pair of the memory cell array while data are being read out of the memory cells so that those memory cells having write-in/read-out margins too small to produce a sufficient difference of potentials or currents for the bit line pair may be detected and rejected.

With a method of conducting a screening test on semiconductor memories in the course of processing the wafers of the memories as described above, it is possible to rigorously control the "1" or "0" data read-out margin of the memory cells by applying a voltage to the pad disposed on the memory chip zone of each memories during a screening test.

With such an arrangement, it will be apparent that all memory cells having small data write-in/read-out margins (that operate defectively) can be detected and rejected.

Thus, with the method of the present invention, screening tests on semiconductor wafers can be carried out with an improved efficiency and, at the same time, the ratio of defective semiconductor memories to the entire population of each lot after packaging can be significantly lowered to reduce the wastes of packaging materials and the cost of performing the final test on them.

Additionally, by replacing defective memory cells having small read-out margins identified by a screening test with redundant bits, the overall yield rate of semiconductor memories can be significantly improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a circuit diagram of part of a first embodiment of DRAM of the present invention;

FIG. 7 is a graph showing voltage waveforms of the DRAM of FIG. 6 obtained when it operates to read out data in a dummy word line drive mode;

FIG. 8 is a graph showing voltage waveforms of the DRAM of FIG. 6 obtained when it operates to read out data in another dummy word line drive mode;

FIG. 9 is a graph showing voltage waveforms of the DRAM of FIG. 6 obtained when it operates to read out data in still another dummy word line drive mode;

FIG. 10 as a graph showing voltage waveforms of the DRAM of FIG. 6 obtained when it operates to read out data in still another dummy word line drive mode;

FIG. 12 as a circuit diagram of an example of DWL potential control circuit that can be used for the embodiment of FIG. 6;

FIG. 13 is a circuit diagram of another example of DWL potential control circuit that can be used for the embodiment of FIG. 6;

FIG. 14 is a circuit diagram of still another example of DWL potential control circuit that can be used for the embodiment of FIG. 6;

FIG. 17 is a circuit diagram of a DRAM obtained by replacing the capacitances of FIG. 6 with capacitances to be used for a dummy DRAM cell;

FIG. 18 is a graph showing voltage waveforms of the DRAM of FIG. 17 typically obtained when it operates to read out data;

FIG. 19 is a circuit diagram of part of a second embodiment of DRAM of the present invention;

FIG. 22 is a circuit diagram of part of a third embodiment of DRAM of the present invention;

FIG. 23 is a graph showing voltage waveforms of the DRAM of FIG. 22 typically obtained when it operates to read out data;

FIG. 24 is a circuit diagram of part of a fourth embodiment of DRAM of the present invention;

FIG. 25 is a graph showing voltage waveforms of the DRAM of FIG. 24 typically obtained when it operates to read out data;

FIG. 26 is a circuit diagram of part of a fifth embodiment of DRAM of the present invention;

FIG. 27 is a graph showing voltage waveforms of the DRAM of FIG. 26 typically obtained when it operates to read out data;

FIG. 30 is a circuit diagram of part of another DRAM to which the method of conducting a screening test on semiconductor memories of the invention is applied;

FIG. 31 is a graph showing timing waveforms of the DRAM of FIG. 30 typically obtained when it operates to read out data;

DETAILED DESCRIPTION OF THE PREFERRED EMBODIMENTS

Figure 1:
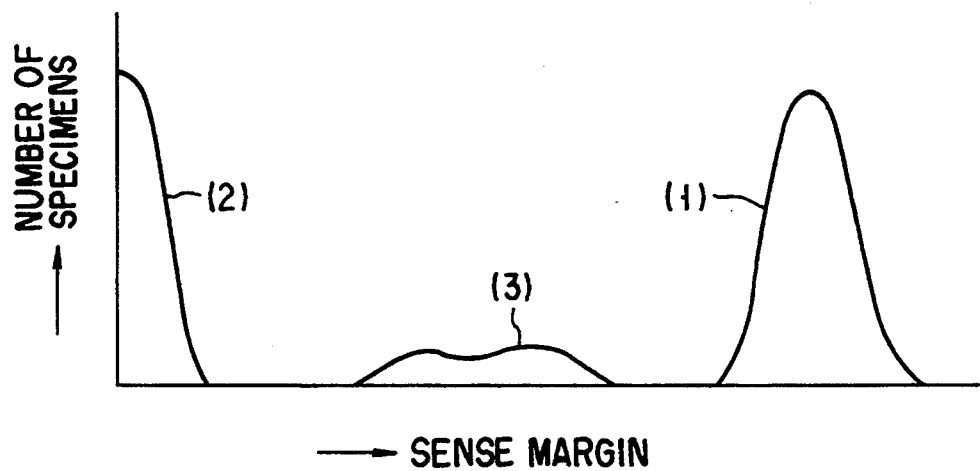
FIG. 1 is a graph showing a frequency curve of variances in the performance of the memory cells contained in the samples of semiconductor memories tested after the completion of wafer processing steps.
Figure 2:
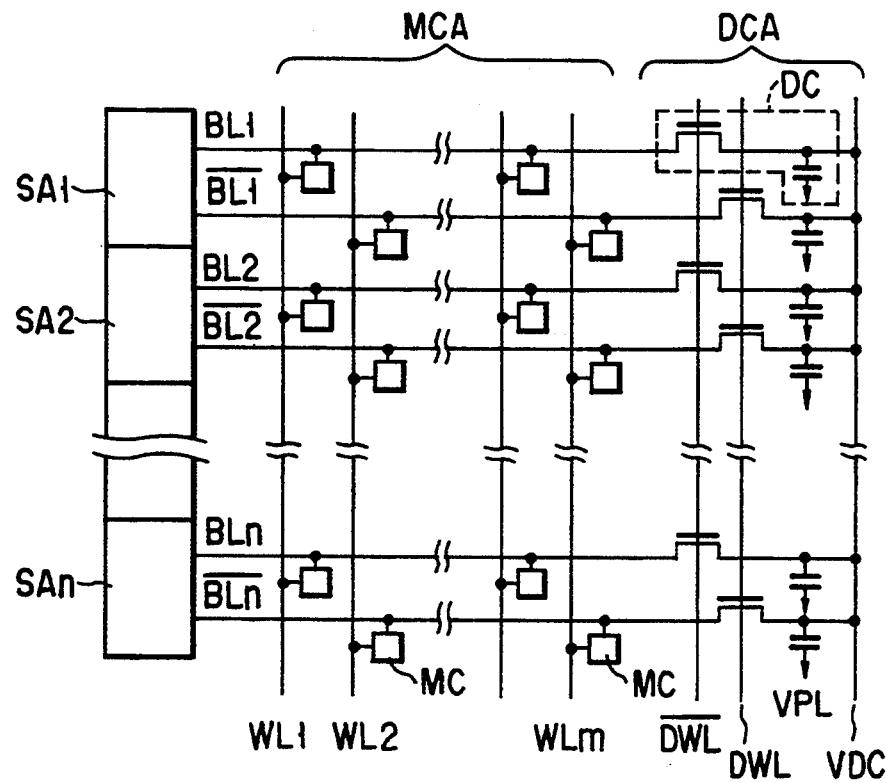
FIG. 2 is a circuit diagram of part of a conventional DRAM.
Figure 3:
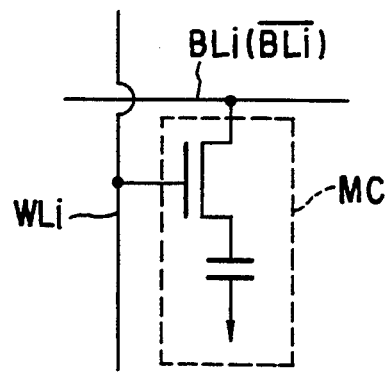
FIG. 3 is a circuit diagram for one of the memory cells of FIG. 2.

The present invention will be described in greater detail by referring to the accompanying drawings that illustrate preferred embodiments of semiconductor memory and method of conducting a screening test on semiconductor memories of the invention. Note that the components that are commonly used in these embodiments are denoted by same reference symbols and will not be described repeatedly.

FIG. 6 is a circuit diagram of part of a first embodiment of DRAM of the present invention, which is formed on a semiconductor chip (DRAM chip) 1.

Reference symbol 10 in FIG. 6 denotes a memory cell array of the DRAM circuit comprising DRAM cells MC, MC, . . . arranged to form a matrix, word lines WL1 through WLm connected to the cells MC, MC, . . . of the respective rows, bit line pairs BL1, /BL1 through BLn, /BLn commonly connected to the cells MC, MC, . . . of the respective columns.

Reference symbol 11 in FIG. 6 denotes a coupling capacitance type dummy cell section comprising a dummy word line DWL connected to the bit lines BL1 through BLn by way of respective capacitances C and another dummy word line /DWL connected to the bit lines /BL1 through /BLn by way of respective capacitances C. Each of these capacitances can be realized by using a MOS-type capacitance or the interlayer capacitance between a MOS-type capacitance or a plate polysilicon and the material of a gate electrode.

Reference symbols 12 and 13 in FIG. 6 respectively denote a dummy word line drive circuit connected to the dummy word lines DWL, /DWL and a dummy word line drive mode determining circuit for determining the mode in which the dummy word lines are driven. Reference numeral 14 denotes a pad formed on the chip in order to apply a voltage to the dummy word line drive mode determining circuit 13 to control the dummy word line drive mode. The dummy word line drive circuit 12, the dummy word line drive mode determining circuit 13 and the pad 14 constitute a dummy word line potential control circuit (DWL potential control circuit) 15.

Figure 4:
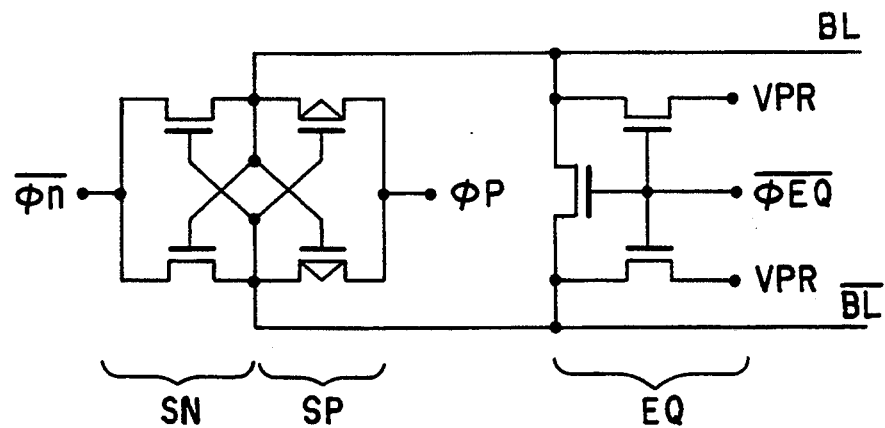
FIG. 4 is a circuit diagram for one of the sense amplifier of FIG. 2.

Sense amplifiers SA1 through SAn are connected to the respective complementary bit line pairs (BL1, /BL1) through (BLn, /BLn) of the memory cell array 10 and designed to amplify the data read out on the bit lines from the memory cell of the selected row and have a configuration as illustrated in FIG. 4. Note that these sense amplifiers may be replaced by a single sense amplifier that can be connected to a bit line pair selected out of a plurality of bit line pairs by switching operation.

FIGS. 7 through FIG. 11 are graphs showing voltage waveforms of the DRAM of FIG. 6 obtained when it operates to read out data in different dummy word line drive modes.

In FIGS. 7 through FIG. 11, reference symbols Vcc and Vcc/2 respectively denote the supply voltage and the precharge voltage of the bit lines, while reference symbols WL, DWL and /DWL respectively denote the word line of the selected column, one of the dummy word lines and the other dummy word line. Reference symbols BL and /BL respectively denote one of the bits lines that is connected to the memory cell of the selected row and the other bit line that is complementary to the former bit line (the bit line to which the capacitance C selected by the dummy word line DWL). Reference symbol vn denotes the voltage attributable to the coupling noise that can be generated on said former bit line BL through the capacitance between the gate and drain of the cell MC of the selected row when the potential of the word line WL of the selected row rises and vd denote the potential attributable to the coupling noise generated on the other bit line /BL when the potential of the dummy word line DWL is raised, while reference symbols v1 and v0 respectively denote the variation in the signal potential that appears when the "1" data in the selected cell MC is read out onto the bit line BL and the variation in the signal potential that appears when the "0" data in the selected cell MC is read out onto the bit line BL.

The drive mode shown in FIG. 7 is a mode that holds both dummy word lines DWL and /DWL inactive when the selected word line WL is activated.

More specifically, after the potentials of the bit line pair (BL, /BL) are released from a precharge equalized condition, the potential of the word line WL of the selected row rises to the step up potential level. As the potential of the word line WL rises, a potential vn attritutable to the coupling noise is generated on the former bit line BL via the capacitance between the gate and the drain of the cell of the selected column. Then, data are read out of the cell of the selected column onto the former bit line BL and, when a difference appears between the bit line pair (BL, /BL), the sense amplifier begins to operate to pull down the potential of the former one of the bit line pair (BL, /BL) and pull up that of the other one of the bit line pair.

with the drive mode of FIG. 7, therefore, a relation ship v1>v0 is held true because, while the potential of the former bit line BL rises by potential vn attributable to the coupling noise generated on the word line WL when the potential of the word line WL is raised, no potential vd attributable to the coupling noise from the dummy word line DWL appear on the other bit line /BL.

The drive mode illustrated in FIG. 8 is same as that of FIG. 7 except that it holds the potential of the dummy word line /DWL to "H" level as long as the selected word line WL is activated and changes the potential of the dummy word line DWL from "H" to "L".

With the drive mode of FIG. 8, therefore, a relationship v1>>v0 is held true because the potential of the former bit line BL rises by potential vn attributable to the coupling noise generated on the word line WL when the potential of the word line WL is raised and, at the same time, the potential of the latter bit line /BL is lowered by potential vd (=−vn) attributable to the coupling noise generated on the dummy word line DWL when the potential of the dummy word line DWL falls.

The drive mode illustrated in FIG. 9 is same as that of FIG. 7 except that it holds the potential of the dummy word line DWL to "L" level as long as the selected word line WL is activated and changes the potential of the dummy word line /DWL from "L" to "H".

With the drive mode of FIG. 9, therefore, a relation ship v1>>v0 is held true because the potential of the former bit line BL rises by potential vn attributable to the coupling noise generated on the word line WL when the potential of the word line WL is raised and, at the same time, the potential of the former bit line BL is raised by potential vd (=vn) attributable to the coupling noise generated on the dummy word line /DWL when the potential of the dummy word line /DWL rises.

The drive mode illustrated in FIG. 10 is same as that of FIG. 7 except that it holds the potential of the dummy word line DWL to "H" level as long as the selected word line WL is activated and changes the potential of the dummy word line /DWL from "H" to "L".

With the drive mode of FIG. 10, therefore, a relationship v1=v0 is held true because the potential vn attributable to the coupling noise generated on the word line WL when the potential of the word line is raised is offset by the potential vd (=−vn) attributable to the coupling noise generated on the dummy word line /DWL when the potential of the dummy word line /DWL falls.

Figure 11:
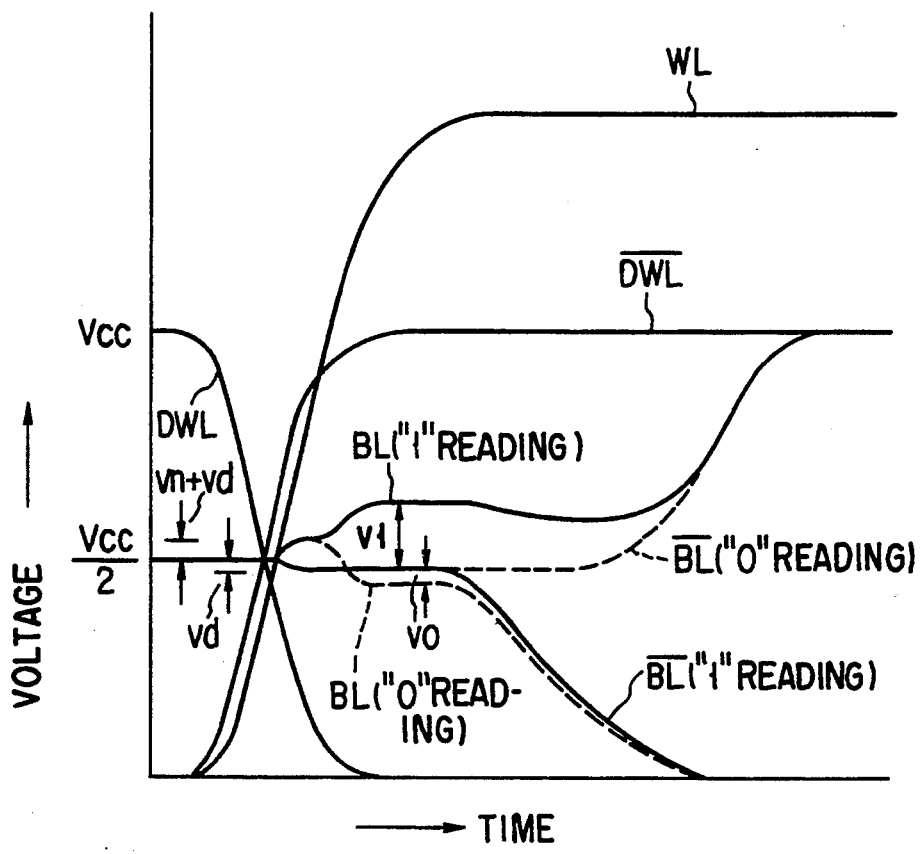
FIG. 11 is a graph showing voltage waveforms of the DRAM of FIG. 6 obtained when it operates to read out data in still another dummy word line drive mode.

The drive mode illustrated in FIG. 11 is same as that of FIG. 7 except that it changes the potential of the dummy word line DWL from "H" to "L" when the selected word line WL is activated and also changes the potential of the dummy word line /DWL from "L" to "H".

With the drive mode of FIG. 11, therefore, a relationship v1>>v0 is held true because the potential of the former bit line BL rises by potential vn attributable to the coupling noise generated on the word line WL when the potential of the word line WL is raised and the potential of the former bit line BL is also raised by potential vd (=vn) attributable to the coupling noise generated on the dummy word line /DWL when the potential of the dummy word line /DWL rises, while, at the same time, the potential of the other bit line /BL falls by potential vd (=vn) attributable to the coupling noise generated on the dummy word line DWL when the potential of the dummy word line DWL falls.

FIGS. 12 through 15 show circuit diagrams of different DWL potential control circuit obtained by modifying the DWL potential control circuit 15 of FIG. 6 such that they are adapted to the respective drive modes of FIGS. 7 through 11.

In FIG. 12 illustrating a modified DWL potential control circuit, 14 denotes a pad, 20 a high resistance connected between the pad 14 and a ground potential (Vss) node, 21 an inverter to which the input node of the pad 14 is connected, 22 a double input AND-gate for receiving the output of the inverter 21 and a word line drive timing signal φWL, 23 a double input NAND gate for receiving a row address signal AOR for selecting one of the bit lines BL1 through BLn and the output of the AND-gate 22, 24 an inverter for inverting the output of the NAND gate 23 and supplying it to the dummy word line DWL, 25 a double input NAND-gate for receiving a row address signal /AOR for selecting one of the bit lines /BL1 through /BLn and the output of the AND-gate 22 and 26 an inverter for inverting the output of the NAND-gate 25 and supplying it to the dummy word line /DWL.

Figure 5:
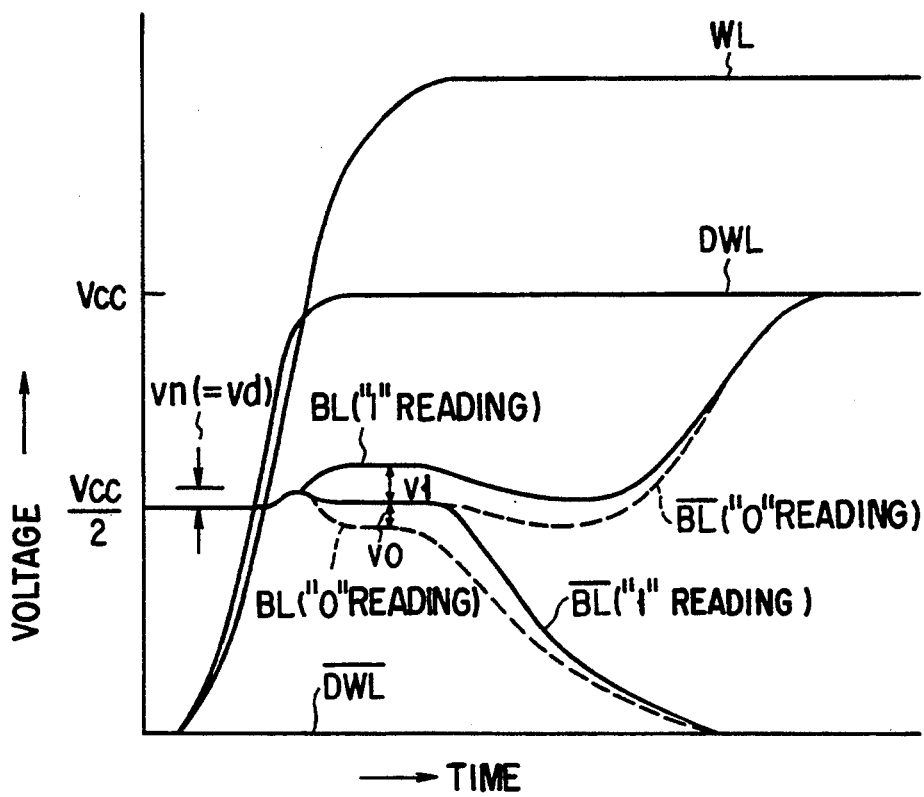
FIG. 5 is a graph showing voltage waveforms of the DRAM of FIG. 2 typically obtained when it operates to read out data.

With a circuit as illustrated in FIG. 12, if the pad 14 is at Vss potential level, the output of the inverter 21 is at "H" level and the dummy word line DWL or /DWL is activated in response to an address signal AOR or /AOR when the applied word line drive timing signal φWL is activated (or set to "H" level in this example). This operation of the circuit is identical with that of a conventional circuit as illustrated in FIG. 5.

On the other hand, when the output of the inverter 21 is set to "L" level by externally applying a "H" level signal to the pad 14, both dummy word lines DWL, /DWL are kept inactive (or set to "L" level in this example) if the word line drive timing signal φWL is activated so that the circuit operates in a manner as illustrated in FIG. 7.

In FIG. 13 illustrating another modified DWL potential control circuit, 14 denotes a pad, 30 a high resistance, 31 an inverter, 32 a triple input NAND-gate for receiving the output of the inverter 31, a word line drive timing signal φWL and a row address signal AOR for selecting one of the bit lines BL through BLn and supplying its output to the dummy word line DWL and 33 a triple input NAND gate for receiving the output of the inverter 31, a word line drive timing signal φWL and a row address signal /AOR for selecting one of the bit lines /BL1 through /BLn and supplying its output to the dummy word line /DWL.

With a circuit as illustrated in FIG. 13, if the pad 14 is at Vss potential level, the output of the inverter 31 is at "H" level and the dummy word line DWL or /DWL is activated in response to an address signal AOR or /AOR when the applied word line drive timing signal φWL is activated so that the circuit operates in a manner as illustrated in FIG. 8.

On the other hand, when the output of the inverter 31 is set to "L" level by externally applying a "H" level signal to the pad 14, both dummy word lines DWL, /DWL are kept inactive if the word line drive timing signal φWL is activated so that the circuit operates in a manner as illustrated in FIG. 7.

In FIG. 14 illustrating a still another modified DWL potential control circuit, 14 denotes a pad, 40 a high resistance, 41a an inverter and 41b another inverter for inverting the output of the inverter (control signal φA) to generate an inverted control signal φB.

42 denotes a double input NAND-gate for receiving a row address signal AOR for selecting one of the bit lines BL1 through BLn and a word line drive timing signal φWL, 43 a clocked inverter that receives the output of the NAND-gate 42 and whose action is controlled by the complementary controls signals φA and φB and 44 an inverter for receiving the output of the NAND gate 42.

45 denotes a clocked inverter that receives the output of the inverter 44 and whose action is controlled by the complementary control signals φA and φB, the clocked inverters 45 and 43 being wired OR to the dummy word line DWL so that their outputs are supplied to the line.

46 denotes a double input NAND-gate for receiving a row address signal /AOR for selecting one of the bit lines /BL1 through /BLn and a word line drive timing signal φWL, 47 a clocked inverter that receives the output of the NAND-gate 46 and whose action is controlled by the complementary control signals φA and φB and 48 an inverter for receiving the output of the NAND gate 46.

49 denotes a clocked inverter that receives the output of the inverter 48 and whose action is controlled by the complementary control signals φA and φB, the clocked inverters 47 and 49 being wired-OR to the dummy word line /DWL so that their outputs are supplied to the line.

With a circuit as illustrated in FIG. 14, if the pad 14 is at Vss potential level, the control signals φA and φB are respectively set to "H"/"L" levels in response to that. Thus, the dummy word line DWL or /DWL is activated in response to an address signal AOR or /AOR when the applied word line drive timing signal φWL is activated. This operation of the circuit is identical with that of a conventional circuit as illustrated in FIG. 5.

On the other hand, if the control signals φA and φB are respectively set to "L"/"H" by externally applying an "H" level signal to the pad 14, the circuit operates in a manner as illustrated in FIG. 8 when the word line drive timing signal φWL is activated.

Figure 15:
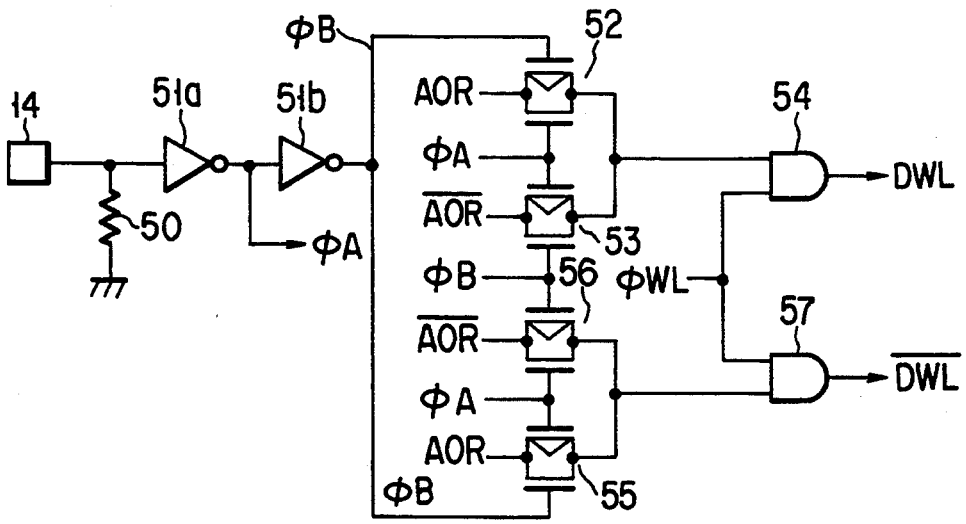
FIG. 15 as a circuit diagram of still another example of DWL potential control circuit that can be used for the embodiment of FIG. 6.

In FIG. 15 illustrating a still another modified DWL potential control circuit, 14 denotes a pad, 50 a high resistance and 51a and 51b inverters.

52 denotes a CMOS transfer gate that receives a row address signal AOR for selecting one of the bit lines BL1 through BLn through one of its terminals and whose action is controlled by the complementary control signals φA and φB.

53 denotes another CMOS transfer gate that receives a row address signal /AOR for selecting one of the bit lines /BL1 through /BLn through one of its terminals and whose action is controlled by the complementary control signals φA and φB. The output terminals of the CMOS transfer gates 52 and 53 are wired OR.

54 denotes a double input AND-gate for receiving the output of the wired OR CMOS transfer gates 52 and 53 and the word line drive timing signal φWL and supplying its output to the dummy word line DWL.

55 denotes a CMOS transfer gate that receives an address signal AOR through one of its terminals and whose action is controlled by the complementary control signals φA and φB, 56 another CMOS transfer gate that receives an address signal /AOR through one of its terminals and whose action is controlled by the complementary control signals φA and φB. The outputs terminals of the CMOS transfer gates 55 and 56 are wired-OR.

57 denotes a double input AND-gate for receiving the output of the wired-OR CMOS transfer gates 55 and 56 and the word line drive timing signal φWL and supplying its output to the dummy word line /DWL.

With a circuit as illustrated in FIG. 15, if the pad 14 is at Vss potential level, the control signals φA and φB are respectively set to "H"/"L" levels in response to that. Thus, the dummy word line DWL or /DWL is activated in response to an address signal AOR or /AOR when the applied word line drive timing signal φWL is activated. This operation of the circuit is identical with that of a conventional circuit as illustrated in FIG. 5.

On the other hand, if the control signals φA and φB are respectively set to "L"/"H" by externally applying an "H" level signal to the pad 14, the circuit operates in a manner as illustrated in FIG. 9 when the word line drive timing signal φWL is activated.

With the first embodiment of DRAM of FIG. 6, when the DWL potential control circuit 15 is so configured that it can selectively use one (e.g, the circuit configuration of FIG. 12) of the dummy word line drive modes of FIGS. 7 through FIG. 9 and FIG. 11 (e.g., the dummy word line drive mode of FIG. 7), any unbalanced condition that may exist between the "1" and "0" data read-out margins can be corrected even if the "1" data read-out margin of the memory cell and therefore the "1" data read-out signal v1 are small by selecting a drive mode that can enlarge the "1" data read-out margin.

Thus, in the course of manufacturing DRAMs, any unbalanced condition is detected between the "0" and "1" data readout margins of a specimen selected from a lot as a result of a soft error test, the unbalanced condition of the specimen along with that of the other DRAMs of the lot can be corrected whenever necessary.

Additionally, the potential of the pad 14 can be secured to "H" level (for instance by wire-bonding to the supply pad so that the dummy word line drive mode to be used for correcting such an unbalanced condition of the DRAM of the lot by the DWL potential control circuit 15 can be semi-permanently maintained for use.

A dummy word line drive mode can be semipermanently maintained for use alternatively by using a fuse circuit of a non volatile program circuit or, still alternatively by changing the connection of the wired layers that are being processed.

The method of conducting a screening test of the invention can be used for DRAMs of FIG. 6.

When conducting a screening test on DRAMs in the state of wafers after the completion of wafer processing operation, the "1" data read-out margin or "0" data read-out margin of each of the memory cells can be controlled more rigorously than the "0" data read-out margin or "1" data read-out margin by applying a control signal onto the pad formed on the chip zone where the DRAM circuit is also formed.

If the DWL potential control circuit 15 is so configured that, for instance, the dummy word line drive mode of FIG. 11 can be selectively used, the "0" data read-out margin can be rigorously controlled when a screening test is conducted on the DRAMs of a lot after the completion of wafer processing operation.

Conversely, the "1" data read out margin can be rigorously controlled by selecting a configuration for the DWL potential control circuit 15 that allows rigorous control of the "1" detected read-out margin.

It will be apparent that, with such an arrangement, any memory cell will be detected as defective if it is found to have narrow "1" and /or "0" data read-out margins.

Thus, with the method of conducting a screening test according to the invention, each and every memory cell having narrow write-in and /or read-out margins (or memory cell that operates only defectively) can be detected and rejected out of a lot of memory cells under test.

Therefore, the present invention provides a very effective and efficient method of conducting a screening test that can remarkably increase the yield rate of semiconductor memories after packaging and reduce the cost of packaging materials and the test.

The overall yield rate can be further improved by replacing detected defective memory cells having a narrow read-out margin as a result of the test with redundant bits.

Figure 16:
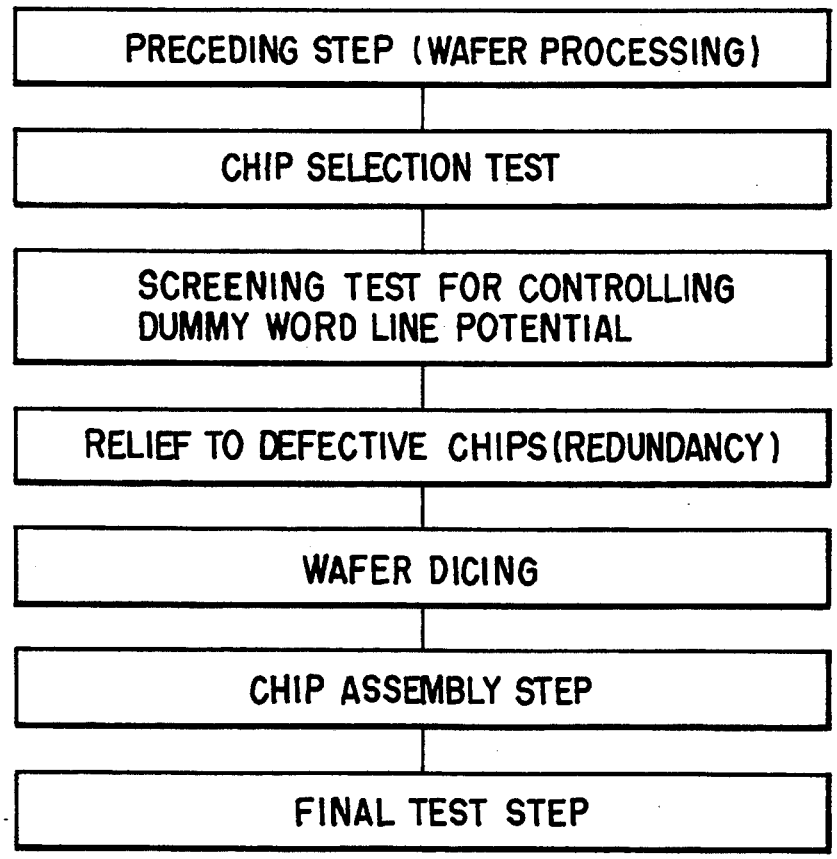
FIG. 16 is a flow chart illustrating the steps of manufacturing a DRAM according to the invention.

FIG. 16 is a flow chart illustrating the steps of manufacturing a DRAM according to the invention. Referring to FIG. 16, firstly in the wafer processing step, a DRAM circuit having a redundant circuit component is formed on each of a plurality of chip zones of a semiconductor wafer along with a pad to which dummy word line potential control signals are applied.

In the next step of chip selection test, a die sort test is conducted on the DRAM circuits to sort out those having acceptable electric characteristics.

In the step of screening test, the read out margins of the memory cells of each DRAM circuit are set to rigorous values to detect any memory cells having narrow data read out margins by applying a dummy word line potential control signal to the pad of the chip zone of the circuit.

In the following redundancy step, the memory cells that are detected as defective ones in the die sort test and the screening test are replaced with redundant circuits to relieve the chip carrying those defective memory cells.

In the wafer dicing step, each chip zone is individually separated from the wafer to produce a DRAM chip.

In the succeeding chip assembly step, the DRAM chips produced in the preceding step are assembled to IC devices.

In the final test step, the manufactured IC devices are subjected to a final test on a lot basis to determine if each lot is good for shipment or not.

FIG. 17 is a circuit diagram of a DRAM obtained by replacing the capacitances of FIG. 6 with capacitances to be used for a dummy DRAM.

One of the terminals of each capacitance C of FIG. 17 is connected to a bit line by way of a MOS transistor Q to be used for a transfer gate and the gate of the MOS transistor Q is connected to the related dummy word lines DWL, or /DWL, while the other terminal (capacitor plate electrode) of the capacitance C is connected to the related dummy cell capacitor plate lines DWL', or /DWL'.

FIG. 18 is a graph showing voltage waveforms of the DRAM of FIG. 17 obtained when it operates to read out data when the word lines and dummy word lines are driven in a selected drive mode.

The drive mode of FIG. 18 is same as that of FIG. 7 except that the DWL drive circuit 12 is so configured that, while the selected word line WL is being activated, the potential of the dummy word line /DWL is held to "L" level, the potential of the dummy word line DWL is changed from "L" to "H" and the potentials of the capacitor plate lines DWL', /DWL' are changed from "H" to "L".

With the above described dummy word line drive mode or the DRAM, the read-out margins of the cell MC can be optionally modified by controlling the potentials of the capacitor plate lines DWL', /DLW'.

Since the coupling noise vn when the potential of the word line rises offset by the coupling noise attributable to the capacitance at the time of the selection of a dummy cell DC, the levels of the bit lines can be defined Only by the coupling noise attributable to the capacitance of the selected cell MC. Therefore, it is possible to clear any unbalanced condition between the capacitances of the bit lines of a bit line pair.

A same signal may be supplied to the capacitor plate lines DWL', /DWL'.

FIG. 19 is a circuit diagram of part of a second embodiment of the DRAM of the present invention. The DRAM of FIG. 19 differs from that of FIG. 6 in that it is capable of selectively use three or more than three dummy word line drive modes by using a plurality of pads (two pads 141 and 142 in this example) and it additionally comprises a dummy word line level determining circuit 16 so that the dummy word lines DWL, /DWL can be driven at a selected level.

In the DRAM of FIG. 19, the DWL potential control circuit 17 is constituted by the dummy word line drive circuit 12, the dummy word line drive mode determining circuit 13, the pads 141 and 142 and the dummy word line level determining circuit 16.

Figure 20:
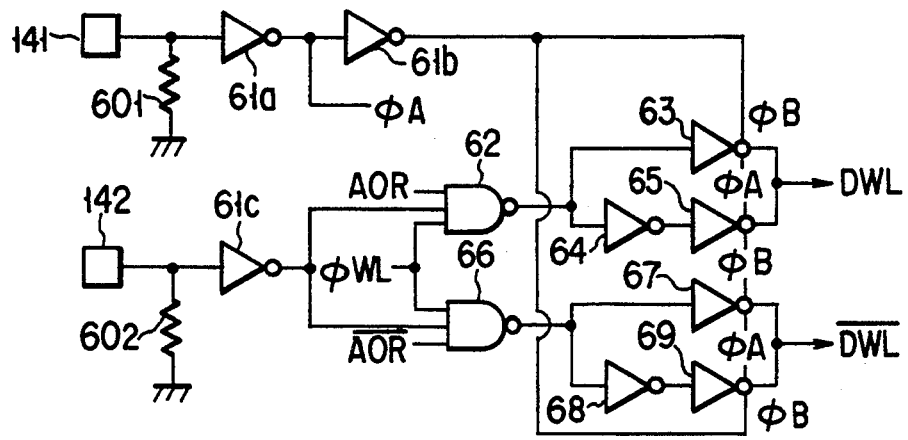
FIG. 20 is a circuit diagram of an example of DWL potential control circuit that can be used for the embodiment of FIG. 19.

FIG. 20 is a circuit diagram of an example of DWL potential control circuit that can be used for the embodiment of FIG. 19. In FIG. 20, 141 denotes a first pad, 601 a high resistance connected between the pad 141 and the Vss potential node, 61a an inverter having its input node connected to the pad 141 and 61b an inverter for generating an inverted control signal $\phi$B by inverting the output (control signal $\phi$A) of the inverter 61a.

142 denotes a second pad, 602 a high resistance connected between the pad 142 and the Vss potential node and 61c a inverter having its input node connected to the pad 142.

62 denotes a triple input NAND-gate for receiving the output of the inverter 61c, a word line drive timing signal $\phi$WL and a row address signal AOR for selecting one of the bit lines BL1 through BLn.

63 denotes a clocked inverter that receives the output of the NAND-gate 62 and whose action is controlled by the complementary control signals $\phi$B and $\phi$A and 64 an inverter for receiving the output of the NAND-gate 62.

65 denotes a clocked inverter that receives the output of the inverter 64 and whose action is controlled by the complementary control signals $\phi$B and $\phi$A. The output terminal of the clocked inverter 69 and that of the clocked inverter 63 are wired-OR so that their out puts are supplied to the dummy word line DWL.

66 denotes a triple input NAND gate for receiving the output of the inverter 61c, a word line drive timing signal $\phi$WL and a row address signal /AOR for selecting one of the bit lines /BL1 through /BLn.

67 denotes a clocked inverter that receives the output of the NAND-gate 66 and whose action is controlled by the complementary control signals $\phi$B and $\phi$A and 68 an inverter for receiving the output of the NAND-gate 66.

69 denotes a clocked inverter that receives the output of the inverter 68 and whose action is controlled by the complementary control signals $\phi$B and $\phi$A. The output terminal of the clocked inverter 69 and that of the clocked inverter 67 are wired-OR so that their out puts are supplied to the dummy word line /DWL.

In this example, voltage Vcc is applied to the dummy word line drive circuit 12 as supply voltage for its operation from a dummy word line level determining circuit (not shown).

In the circuit of FIG. 20, the control signals $\phi$A and $\phi$B are respectively at "H" and "L" levels if the potential of the first pad 141 is at the level of Vss. The output of the inverter 61c is at "H" level if the potential of the second pad 142 is at the level of Vss. Therefore, once the word line drive timing signal $\phi$WL is activated, the dummy word line DWL or /DWL is activated in response to the address signal AOR or /AOR. This operation of the circuit is similar to that of the conventional circuit of FIG. 5.

On the other hand, the circuit shows voltage waveforms similar to those of FIG. 7 if the potential of the first pad 141 is held to Vss and the output of the inverter 61c is turned to "L" level by externally applying a "H" level signal to the second pad 142.

Conversely, the circuit exhibits voltage waveforms similar to those of FIG. 8 if the potential of the second pad 142 is held to Vss and the control signals $\phi$A and $\phi$B are respectively turned to "L"/"H" levels by externally applying a "H" level signal to the first pad 141.

Figure 21:
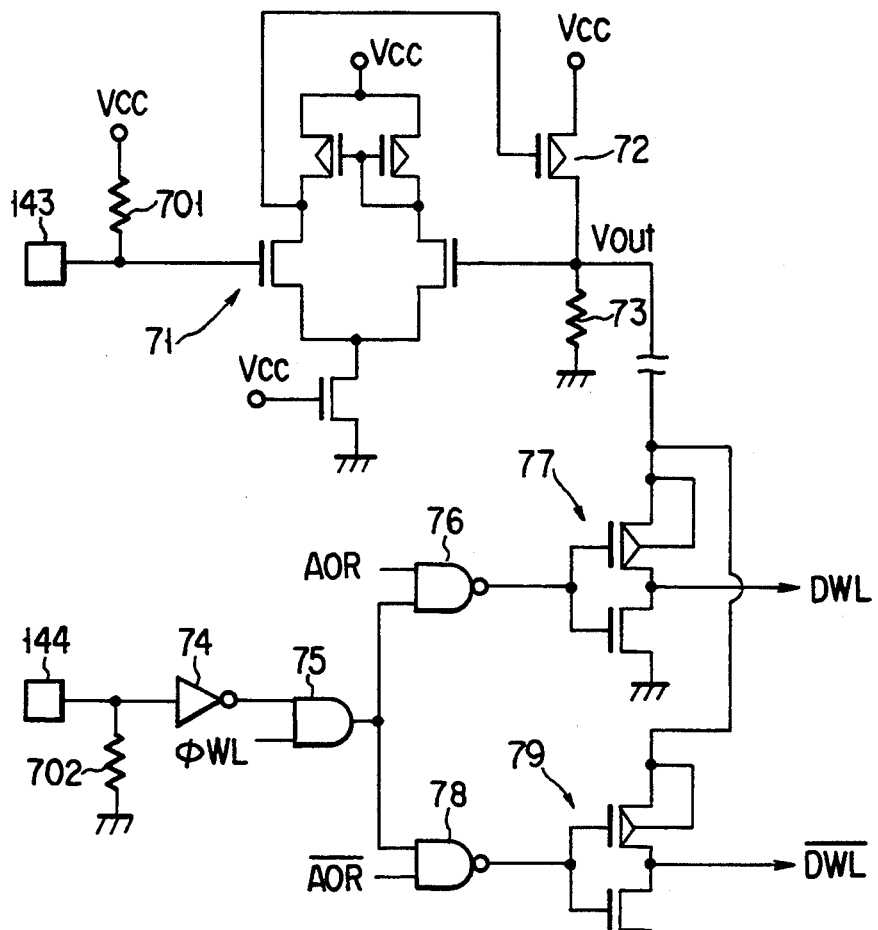
FIG. 21 is a circuit diagram of another example of DWL potential control circuit that can be used for the embodiment of FIG. 19.

FIG. 21 is a circuit diagram of another example of DWL potential control circuit that can be used for the embodiment of FIG. 19.

In FIG. 21,143 denotes a third pad, 701 a high resistance connected between the pad 143 and the Vcc potential node and 71 a Current Mirror load type CMOS differential amplifier circuit having one of its input nodes connected to the pad 143.

72 denotes a P-channel MOS transistor having its source /drain connected between the Vcc potential node and the other input node of the differential amplifier circuit 71 and its gate connected one of the output nodes of the differential amplifier circuit 71 and 73 a resistance connected between the other input node of the differential amplifier circuit 71 and the Vss potential node with such an arrangement, a voltage Vout obtained by lowering the potential Vcc is applied to the other input node of the differential amplifier circuit 71.

144 denotes a fourth pad, 702 a high resistance connected between the pad 144 and the Vss potential node. 74 an inverter having its input node connected to the pad 144 and 75 a double input AND-gate for receiving the output of the inverter 74 and a word line drive timing signal $\phi$WL.

76 denotes a double input NAND gate for receiving the output of the AND-gate 75 and a row address signal AOR for selecting one of the bit lines BL1 through BLn and 77 a CMOS inverter that receives the output of the NAND-gate 76 and to which the lowered voltage Vout is applied as high potential side supply voltage, the output of the inverter 77 being supplied to the dummy word line DWL.

78 denotes a double input NAND-gate for receiving the output of the AND-gate 75 and a row address signal AOR for selecting one of the bit lines /BL1 through /BLn and 79 a CMOS inverter that receives the output of the NAND-gate 78 and to which the lowered voltage Vout is applied as high potential side supply voltage, the output of the inverter 79 being supplied to the dummy word line /DWL.

In this example, a single pad 144 is used as pad for selecting a dummy word line drive mode to be used.

In the circuit of FIG. 21, a potential Vcc appears on the other input node of the differential amplifier circuit 71 if the potential of the third pad 143 is at the level of Vss. The output of the inverter 74 is at "H" level if the potential of the fourth pad 144 is at the level of Vss. Therefore, once the word line drive timing signal $\phi$WL is activated, the dummy word line DWL or /DWL is activated in response to the address signal AOR or /AOR. This operation of the circuit is similar to that of the conventional circuit of FIG. 5.

The circuit shows voltage waveforms similar to those of FIG. 7 if the output of the inverter 74 is turned to "L" level by externally applying a "H" level signal to the fourth pad 144.

If, on the other hand, a potential lower than the voltage Vcc is externally applied to the third pad 143, a reduced potential Vout corresponding to the applied potential appears on the other input node of the differential amplifier circuit 71.

With such an arrangement, it is now possible to optimize the read-out margins of each cell and rigorously control the read-out margins of cells at a screening test.

FIG. 22 is a circuit diagram of part of a third embodiment of DRAM of the present invention (showing a column of a cell array and a dummy word line drive system).

In FIG. 22, (BL, /BL) denotes a complementary bit line pair, SA a bit line sense amplifier, MC a plurality of memory cells (only one of the cells is shown) connected to the bit line pair (BL, /BL), WL a word line, VPL the memory cell capacitor plate potential, VBL the bit line precharge potential, 80 a bit line precharge equalizing circuit and /EQL an equalizing signal. It is assumed here that the memory cell has a capacitance of CS and each of the bit line pair (BL, /BL) has a capacitance of CBL.

C1 denotes a coupling capacitance (dummy cell) connected to the bit line BL, C0 a coupling capacitance (dummy cell) connected to be bit line /BL, DWL1 a dummy word line connected to the BL side capacitance C1, DWL0 a dummy word line connected to the /BL side capacitance C0, 81 a DWL drive circuit, 82 a DWL switch pad, 83 a data input pad and 84 a DWL potential control circuit which comprises a pair of NAND-gate 85, 86, three CMOS inverters 87 through 89 and a high resistance 90.

The DWL potential control circuit 84 is provided with a first selection feature of capable of either activating one of the dummy word lines DWL1, DWL0 or deactivating both of them when the word line WL is activated and a second selection feature of capable of selecting the one to be activated when either one of the dummy word lines DWL1, DWL0 is activated by the first selection feature.

The DWL switch pad 82 is designed to send a switch signal for selecting either the operation of supplying the output of the DWL drive circuit 81 to the dummy word line DWL1 or that of supplying the output to the dummy word line DWL0 via the DWL potential control circuit 84 and connected to the Vss potential via the high resistance 90.

The data input pad 83 is designed to supply data for selecting either the dummy word line DWL1 or the dummy word line DWL0 as the destination for sending the output of the DWL drive circuit 81.

If a DRAM having a circuit as illustrated in FIG. 22 is packaged without bonding the DWL switch pad 82 and the data input pad 83, the potential of the DWL switch pad 82 is at the level of Vss under the packaged condition and the potentials of the dummy word lines DWL1 and DWL0 are turned to "L" level by the output voltage of the DWL potential control circuit 84 whereas the two capacitances C1 and C0 show a same coupling capacitance relative to the bit line pair (BL, /BL).

If, on the other hand, the DWL switch pad 82 is turned to level "H" at the time of the DRAM screening test, the two capacitances C1 and C0 show different coupling capacitances relative to the bit line pair (BL, /BL) according to the input level of the data input pad 83.

If, in this case, the DWL switch pad 82 and the data input pad 83 are turned respectively to "H" and "L" levels, only the potential of the dummy word line DWL0 is raised by the output voltage of the DWL potential control circuit 84. Conversely, if both the DWL switch pad 82 and the data input pad 83 are turned to "H" level, only the potential of the other dummy word line DWL1 is raised by the output voltage of the DWL potential control circuit 84.

FIG. 23 is a graph showing waveforms of some components of the DRAM of FIG. 22 obtained when it operates to read out data.

Since equalizing signal /EQ is at "H" level in a stand by state, the bit line pair (8L, /BL) are connected to the bit line precharge potential VBL. It is assumed here that either data "0" or "1" is written in the memory cell MC in the preceding operation cycle.

When the /RAS (row address strobe) signal is turned to "L" level (activation level) to start a read-out operation, the word line WL is turned to "H" level to read data written in the memory cell MC onto the bit line BL. If data "0" has been written in the memory cell MC in the preceding operation cycle, the DWL switch pad 82 is turned to "H" level and the data input pad 83 is turned to "L" level when the data is read out. Consequently, only the potential of the dummy word line DWL0 rises and the potential of the bit line /BL is slightly raised by the coupling capacitance of the capacitance CO connected to the dummy word line DWL0 so that the difference of the potentials of the bit line pair (BL, /BL) and the sense margin are narrowed.

If, conversely, data "1" has been written in the memory cell MC in the preceding operation cycle, the DWL switch pad 82 is turned to "H" level and the data input pad 83 is also turned to "H" level when the data is read out. Then, only the potential of the other dummy word line DWL1 rises and consequently the potential of the bit line BL is slightly raised by the coupling capacitance of the capacitance C1 connected to the dummy word line DWL1 so that the difference of the potentials of the bit line pair (BL, /BL) and the sense margin are narrowed.

As described above, the DWL potential control circuit 84 of the third embodiment of DRAM illustrated in FIG. 22 is provided with a first selection feature of capable of either activating one of the dummy word lines DWL1, DWL0 or deactivating both of them when the word line WL is activated and a second selection feature of capable of selecting the one to be activated when either one of the dummy word lines DWL1, DWL0 is activated by the first selection feature.

Thus, when DRAMs are subjected to a screening test according to the invention after the completion of a wafer processing operation, the potential or current difference between the bit line pair for the memory cell storing the data to be read out can be forcibly reduced to narrow the data read-out margins of the memory cell by simply activating either the first or the second dummy word line so that the stored data may be read out with difficulty. Consequently, memory cells inherently having narrow write-in/read-out margins can be easily identified as defective memory cells.

The operation of varying the read-out margin can be carried out within a minimum cycle as in the case of ordinary data reading/writing operation.

FIG. 24 is a circuit diagram of part of a fourth embodiment of DRAM of the present invention.

The DRAM of FIG. 24 is same as that of FIG. 22 except that its DWL potential control circuit 91 has a configuration different from that of its counterpart and its DWL switch pad 82 and data input pad 83 operate differently from their counterparts of the DRAM of FIG. 22.

The DWL potential control circuit 91 comprises an exclusive-OR circuit 92, two CMOS transfer gates 93, 94, two COMS inverters 95, 96, two N channel transistors 97, 98 and a high resistance 90.

The DWL potential control circuit 91 is provided with a first selection feature of capable of either activating the two dummy word lines DWL1, DWL0 in opposite phases or keeping both of them inactive and a second selection feature of capable of inverting the phases of the two dummy word lines DWL1, DWL0 when the two dummy word lines DWL1, DWL0 are activated in opposite phase by means of the first section feature.

The DWL switch pad 82 is designed to either transmit the output of the DWL drive circuit 81 and that of the data input pad 83 to both of the dummy word lines DWL1, DWL0 or reduce the potential of the dummy word line DWL1 and that of the dummy word line DWL0 to the level of Vss and connected to the Vss potential via the high resistance 90.

The data input pad 83 is designed to send data to the two dummy word lines DWL1, DWL0 that inverts the phases of the lines.

If a DRAM having a circuit as illustrated in FIG. 24 is packaged without bonding the DWL switch pad 82 and the data input pad 83, the potential of the DWL switch pad 82 is at the level of Vss under the packaged condition and both of the two transistors 97, 98 are turned on while the potentials of the dummy word lines DWL1 and DWL0 are not raised.

If, on the other hand, the DWL switch pad 82 is turned to level "H" at the time of the DRAM screening test, both of the two CMOS transfer gates 93, 94 are turned on so that the output of the DWL drive circuit 81 is transmitted to the dummy word lines DWL1, DWL0 in opposite phase after passing through the exclusive OR circuit 92 as a function of the input level of the data input pad 83.

FIG. 25 is a graph showing waveforms of some components of the DRAM of FIG. 24 obtained when it operates to read out data.

Since equalizing signal /EQ is at "H" level in a standby state, the bit line pair (BL, /BL) are connected to the bit line precharge potential VBL. It is assumed here that, for example, data "0" is written in the memory cell MC in the preceding operation cycle and the DWL switch pad 82 is set to "H" level whereas the data input pad 83 is set to "L" level. Under this condition, the dummy word line DWL0 is at "H" level and the dummy word line DWL1 is at "L" level.

When a read out operation is started, the word line WL is turned to "H" level to read out data "0" that has been written in the memory cell MC onto the bit line BL and the potential of the bit line BL falls. At this time, the dummy word line DWL1 turns from "L" level to "H" level and the dummy word line DWL0 turns from "H" level to "L" level. Then, the potential of the BL line is slightly raised by the coupling capacitance of the capacitances C1, CO so that the difference of the potentials of the bit line pair (BL, /BL) and the sense margin are narrowed.

If, conversely, data "1" has been written in the memory cell MC in the preceding operation cycle, the DWL switch pad 82 is turned to "H" level and the data input pad 83 is also turned to "H" level when the data is read out. Then, the relationship between the potential of the dummy word line DWL1 and that of the dummy word line DWL0 is reversed so that, again, the difference of the potentials of the bit line pair (BL, /BL) and the sense margin are narrowed.

As described above, the DWL potential control circuit 91 of the fourth embodiment of DRAM illustrated in FIG. 24 is provided with a first selection feature of capable of either activating the two dummy word lines DWL1, DWL0 in opposite phases or keeping both of them inactive and a second selection feature of capable of inverting the phases of the two dummy word lines DWL1, DWLO when the two dummy word lines DWL1, DWLO are activated in opposite phase by means of the first section feature.

Thus, when DRAMs are subjected to a screening test according to the invention after the completion of a wafer processing operation, the potential or current difference between the bit line pair for the memory cell storing the data to be read out can be forcibly reduced to narrow the data read out margins of the memory cell by simply reversing the phase relationship between the first dummy word line and the second dummy word line. Consequently, memory cells inherently having narrow write in/read-out margins can be easily identified as defective memory cells.

FIG. 26 is a circuit diagram of part of a fifth embodiment of DRAM of the present invention.

The DRAM of FIG. 26 is same as that of FIG. 22 except that it does not have dummy cells and employs a sense system where the potential for reading out data from a memory cell is compared with the bit line precharge potential.

In the circuit diagram of FIG. 26, 100 denotes a bit line precharge circuit, /BPC a bit line precharge signal, 101 a bit line precharge potential line on the bit line BL side, 102 a bit line precharge potential line on the bit line /BL side, 103 an internal VBL generating circuit, 104 a VBL switch pad, 105 an external VBL input pad, 106 an external /VBL input pad and 107 an internal VBL.external VBL switch circuit. The internal VBL.external VBL switch circult 107 comprises four N-channel transistors 108 through 111, a CMOS inverter 112 and a high resistance 90.

The internal VBL.external VBL switch circuit 107 is designed to selectively receive the output (internal VBL) of the internal VBL generating circuit 103 or the input of the external VBL input pad 105 and that of the external /VBL input pad 106 and supply it to the bit line precharge potential lines 101, 102.

The VBL switch pad 104 is connected to the Vss potential via the high resistance 90. When the VBL switch pad 104 is at "L" level, the N-channel transistors 108, 109 are turned on and the N channel transistors 110, 111 are turned off so that the output of the internal VBL generating circuit 103 is transmitted to the bit line precharge lines 101, 102 by way of the N-channel transistors 108, 109.

When, on the other hand, the VBL switch pad 104 is set to "H" level, the N-channel transistors 108, 109 are turned off and the N channel transistors 110, 111 are turned on so that the input of the external VBL input pad 105 and that of the external /VBL input pad 106 are transmitted to the bit line precharge potential lines 101, 102 by way of the N-channel transistors 110, 111.

If a DRAM having a circuit as illustrated in FIG. 26 is packaged without bonding the VBL switch pad 104, the external VBL input pad 105 and the external /VBL input pad 106, the potential of the VBL switch pad 104 is at the level of Vss under the packaged condition and the output of the internal VBL generating circuit 103 is transmitted to the bit line precharge potential lines 101, 102.

If, on the other hand, the VBL switch pad 104 is set to "H" level at the time of the DRAM screening test, the input of the external VBL input pad 105 and that of the external /VBL input pad 106 are transmitted to the bit line precharge potential lines 101, 102.

FIG. 27 is a graph showing waveforms of some components of the DRAM of FIG. 26 obtained when it operates to read out data.

Since bit line precharge signal /BPC is at "H" level in a stand by state, the bit line precharge circuit 100 is turned on. If it is assumed here that, for example, the VBL switch pad 104 is set to "H" level, the bit line BL is connected to the external VBL input pad 105 and the bit line /BL is connected to the external /VBL input pad 106. If data "0" has been written in the memory cell MC, the relationship [input potential VBL of the external VBL input pad 105 > input potential /VBL of the external /VBL input pad 106] will be maintained.

When a read-out operation is started, the word line WL is turned to "H" level to read out data "0" that has been written in the memory cell MC onto the bit line BL and the potential of the bit line BL falls. Since, however, there is still a difference between the externally applied voltages (VBL, /VBL) and, therefore, the difference of the potentials of the bit line pair (BL, /BL) under this condition as compared with the difference of the potentials under the condition where both bit lines (BL, /BL) are precharged to an equal potential and consequently the sense margin are narrowed.

If, conversely, data "1" has been written in the memory cell MC, again, the difference of the potentials of the bit line pair (BL, /BL) can be made narrower than the difference of the corresponding potentials under the condition where both bit lines (BL, /BL) are precharged to an equal potential and consequently the sense margin are narrowed and consequently the sense margin are narrowed by maintaining the relationship [input potential VBL of the external VBL input pad 105 < input potential /VBL of the external /VBL input pad 106].

While precharge voltages (VBL. /VBL) are applied to the bit line pair (BL, /BL) respectively via the external VBL input pad 105 and the external /VBL input pad 106 in order to bring the line pair to respective potentials that are different from each other in the above description, such precharge voltages (VBL, /VBL) may alternatively be generated within the memory chip without causing any problem.

The fifth embodiment of DRAM of the invention as described above by referring to FIG. 26 is provided with a precharge circuit 100 for precharging the bit line pair (BL, /BL) with respective voltages that are different from each other.

Thus, when DRAMs are subjected to a screening test according to the invention after the completion of a wafer processing operation, the potential or current difference between the bit line pair for the memory cell storing the data to be read out can be forcibly reduced to narrow the data read out margins of the memory cell by simply precharging the bit line pair (BL, /BL) with respective voltages that are different from each other. Consequently, memory cells inherently having narrow write-in/readout margins can be easily identified as defective memory cells.

Figure 28:
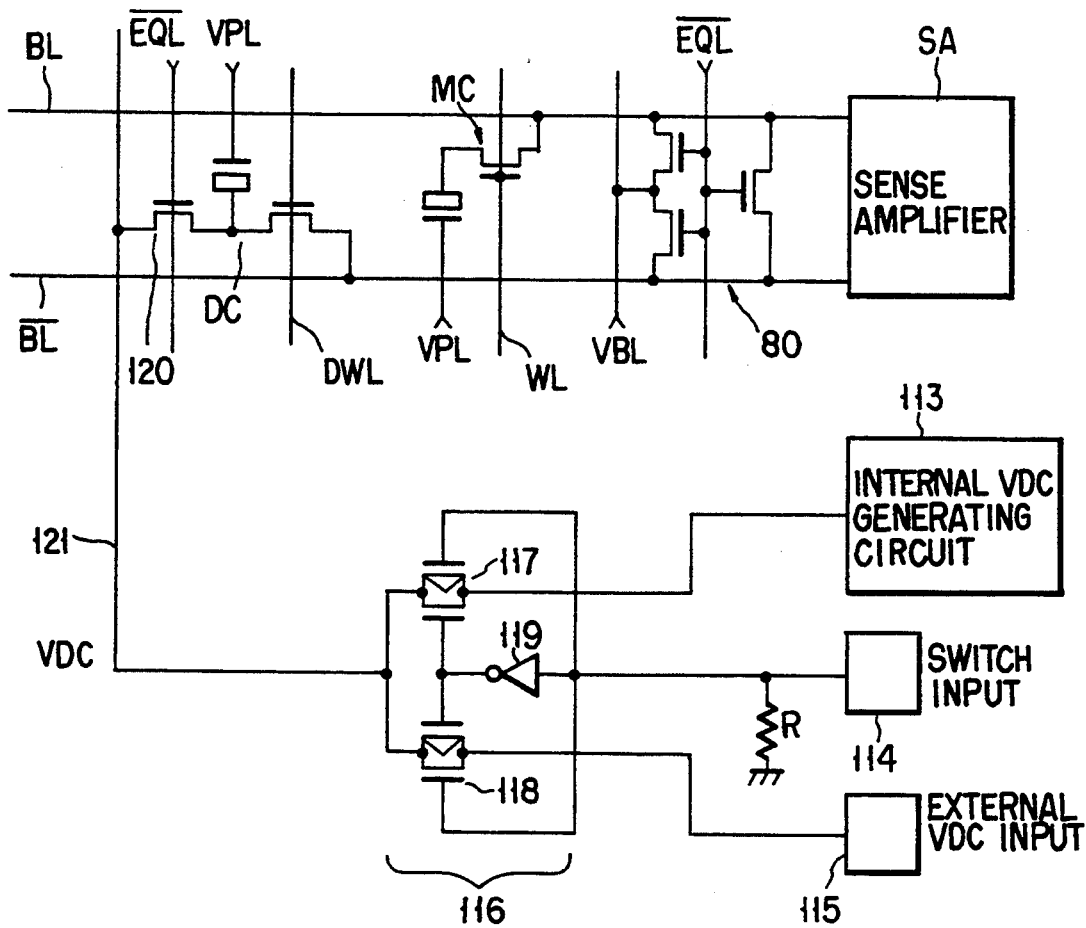
FIG. 28 is a circuit diagram of part of a DRAM to which the method of conducting a screening test on semiconductor memories of the invention is applied.
Figure 32:
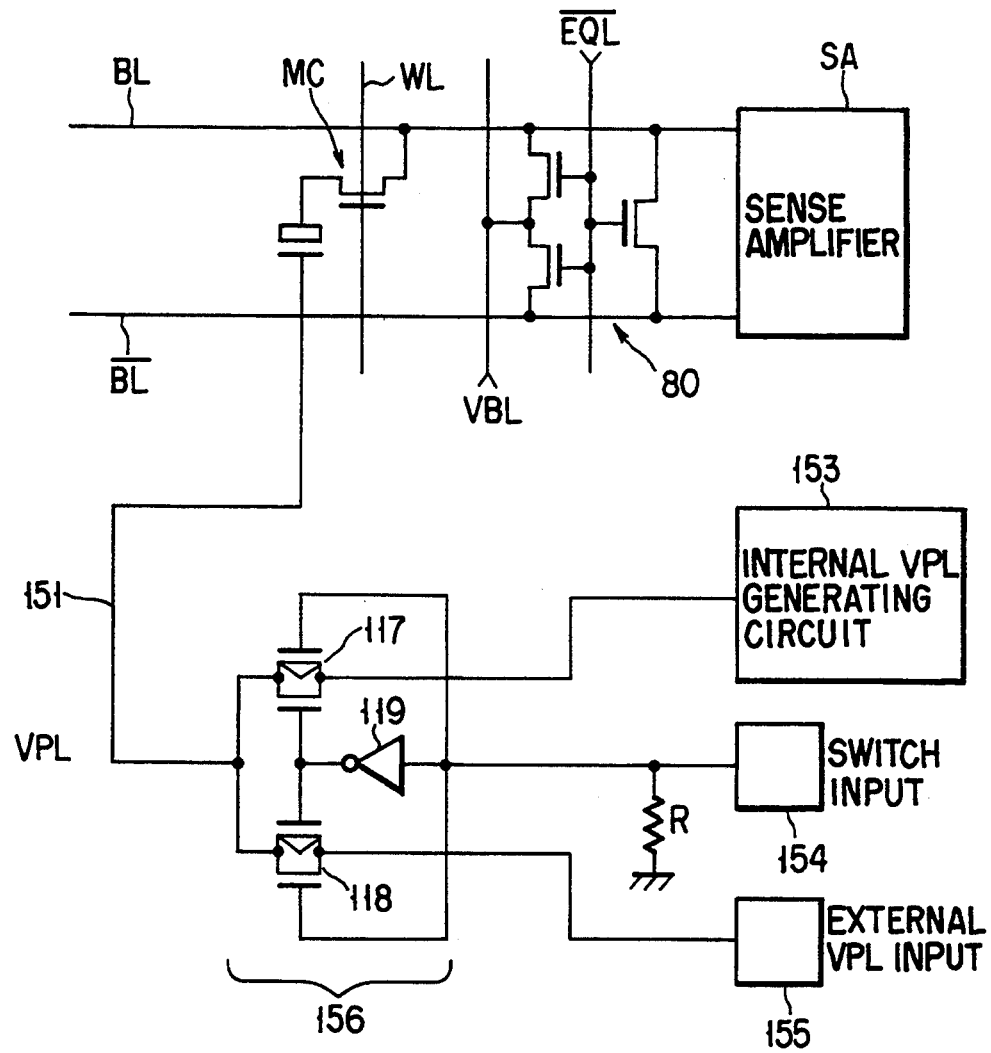
FIG. 32 is a circuit diagram of part of still another DRAM to which the method of conducting a screening test on semiconductor memories of the invention is applied.

Each of FIGS. 28, 30 and 32 is a circuit diagram of part of a DRAM to which the method of conducting a screening test on semiconductor memories of the invention is applied.

The DRAM of FIG. 28 is same as that of FIG. 22 except that it employs a technique of sensing the potential of reading out data from the memory cell by comparing them with the dummy cell data read-out potential and controlling the dummy cell data write in potential.

In FIG. 28, DC denotes dummy cells connected to each bit lines (BL, /BL) on a one by one basis, DWL a dummy word line. 120 a dummy write-in circuit, 121 a dummy write-in potential line, VDC a dummy write-in potential, 113 an internal VDC generating circuit, 114 a VDC switch pad, 115 an external VDC input pad and 116 an internal VDC.external VDC switch circuit. The switch circuit 116 comprises two CMOS switch 117, 118 and a CMOS inverter 119.

It is assumed here that the capacitance of the memory cell MC and that of the dummy cell DC are equal to CS and the capacitance of each of the bit line pair (BL, /BL) is equal to CBL.

The VDC switch pad 114 and internal VDC.external VDC switch circuit 116 are designed to selectively supply the output (internal VDC) of the internal VDC generating circuit 113 or the input (external VDC) of the external VDC input pad 115 to the dummy cell write in potential line 121.

when the VDC switch pad 114 is set to "L" level (Vss potential), the output of the internal VDC generating circuit 113 is transmitted to the dummy cell write-in potential line 121 by way of the CMOS switch 117.

When, on the other hand, the VDC switch pad 114 is set to "H" level, the input from the external VDC input pad 115 is transmitted to the dummy cell write-in potential line 121 by way of the CMOS switch 118.

The VDC switch pad 114 is connected to the Vss potential by way of a high resistance R and if a DRAM having a circuit as described above is sealed in a normal package without bonding the VDC switch pad 114 and the external VDC input pad 115, the output of the internal VDC generating circuit 113 is transmitted to the dummy cell write-in potential line 121 under the packaged condition.

If, on the other hand, the VDC switch pad 114 is set to "H" level at the time of the screening test, the input of the external VDC input pad 115 is transmitted to the dummy cell write-in potential line 121.

Figure 29:
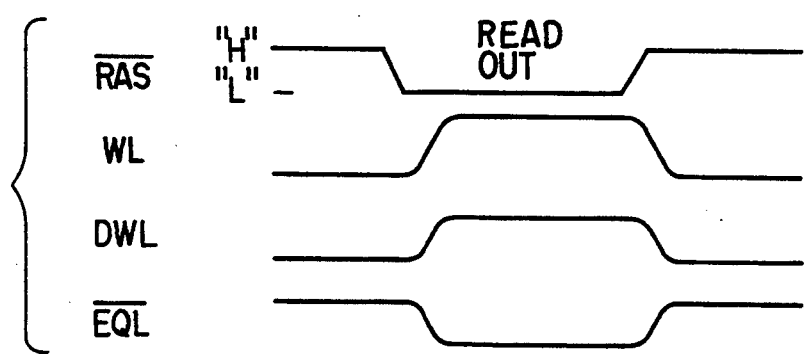
FIG. 29 is a graph showing timing waveforms of the DRAM of FIG. 28 typically obtained when it operates to read out data.

FIG. 29 is a graph showing waveforms of the circuit of FIG. 28 obtained when it operates to read out data.

Since equalize signal /EQL is at "H" level in a stand-by state, the bit line pair (BL, /BL) are connected to the bit line precharge potential VBL and the dummy cell DC is connected to the dummy cell write in potential VDC. Either data "0" data or "1" data is written in the memory cell MC in the preceding cycle of operation.

When the /RAS (row address Strobe) signal is turned to "L" level (activation level) to start a read-out operation, the word line WL and the dummy word line DWL are turned to "H" level to read data respectively written in the memory cell MC and the dummy cell DC onto the respective bit lines BL and /BL.

Since the electric charge is preserved under the stand-by state and during the read-out operation, if the potential of the bit line /BL is assumed to be V/BL' after the data read-out operation, the following formula holds true.

$$(VDC-VPL)CS+VBL.CBL=(V/BL'-VPL)CS+V/HL'.CBL$$

Thus, the potential V /BL' of the bit line /BL after the data read-out operation will be expressed by the equation below.

$$V/BL'=(VBL.CBL+CS.VDC)/(CBL+CS)$$

If, on the other hand, the potential of the memory cell connected to the bit line BL under a stand-by state is assumed to be VCELL, the value of VCELL will be equal to Vcc when data "1" is read-out and 0V when data "0" is read-out. If the potential of the bit line BL after the data read out operation is assumed to be VBL' and considering that the electric charge is preserved, the following equation will be obtained.

$$(VCELL-VPL)CS+VBL.CBL=(VBL'-VPL)CS+VBL'.CBL$$

Thus, the potential VBL' of the bit line BL after the data read-out operation will be expressed by the equation below.

$$VBL'=(VBL.CBL+CS.VCELL)/(CBL+CS)$$

Since the sense margin is defined as the difference of the potentials of the bit line pair (BL, /BL), the following equation can be obtained.

$$V/BL'-VBL'=(CS(VDC-VCELL))/(CBL+CS) \quad (1)$$

From the equation (1) above, it will be seen that the sense margin is not related to the bit line precharge voltage VBL nor the capacitor plate voltage VPL and depends solely on the dummy cell write-in voltage VDC.

In other words, the sense margin can be narrowed by bringing the external VDC input close to the supply volt age Vcc when data "1" is read out whereas it can be narrowed by bringing the external VDC input close to 0V when data "0" is read out so that memory cells inherently having narrow write-in/read-out margins can be identified as defective memory cells.

The DRAM of FIG. 30 is same as that of FIG. 26 except that it employs a technique of applying the potential of the bit line precharge potential VBL to the bit line pair (BL, /BL).

In FIG. 30, 80 denotes a bit line precharge equalizing circuit, 131 a bit line precharge potential line, 134 a VBL switch pad, 135 an external VBL input pad and 116 an internal VBL.external VBL switch circuit. It is assumed here that the capacitance of the memory cell MC is equal to CS and the capacitance of each of the bit line pair (BL, /BL) is equal to CBL.

The VBL switch pad 134 and internal VBL.external VBL switch circuit 116 are designed to selectively supply the output (internal VBL) of the internal VBL generating circuit 103 or the input (external VBL) of the external VBL input pad 135 to the bit line precharge potential line 131.

When the VBL switch pad 134 is set to "L" level, the output of the internal VBL generating circuit 103 is transmitted to the bit line precharge potential line by way of the CMOS switch 117.

When, on the other hand, the VBL switch pad 134 is set to "H" level, the input from the external VBL input pad 135 is transmitted to the bit line precharge potential line 131 by way of the CMOS switch 118.

The VBL switch pad 134 is connected to the Vss potential by way of a high resistance R and if a DRAM having a circuit as described above is sealed in a normal package without bonding the VBL switch pad 134 and the external VBL input pad 135, the output of the internal VBL generating circuit 103 is transmitted to the bit line precharge potential line 131 under the packaged condition.

If, on the other hand, the VBL switch pad 134 is set to "H" level at the time of the screening test, the input of the external VBL input pad 135 is transmitted to the bit line precharge potential line 131.

FIG. 31 is a graph showing waveforms of the circuit of FIG. 30 obtained when it operates to read out data.

Since equalize signal /EQL is at "H" level in a stand by state, the bit line pair (BL, /BL) are connected to the bit line precharge potential VBL. Either data "0" data or "1" data is written in the memory cell MC in the preceding cycle of operation.

When data read-out operation is started, the word line WL is turned to "H" level and the data written in the memory cell MC is read out onto the bit line BL. Since the other bit line /BL of the bit line pair is not connected to the dummy cell, its potential is not changed after the data read out operation. Thus, the potential V/BL' of the bit line /BL will be expressed by the formula below after the data read-out operation.

$$V/BL' = VBL$$

If, on the other hand, the potential of the memory cell connected to the bit line BL under a stand-by state is assumed to be VCELL, the value of VCELL will be equal to Vcc when data "1" is read-out and 0V when data "0" is read-out. Then, the potential VBL' of the bit line BL after the data read-out operation will be expressed by the equation below because of the law of preservation of electric charge.

$$(VCELL - VPL)CS + VBL.CBL = (VBL' - VPL)CS + VBL'.CBL$$

Thus, the potential VBL' of the bit line BL after the data read-out operation will be expressed by the equation below.

$$VBL' = (VBL.CBL + CS.VCELL)/(CBL + CS)$$

Since the sense margin is defined as the difference of the potentials of the bit line pair (BL, /BL), the following equation can be obtained.

$$V/BL' - VBL' = (CS(VBL - VCELL))/(CBL + CS) \quad (2)$$

From the equation (2) above, it will be seen that the sense margin depends on the bit line precharge voltage VBL.

In other words, the sense margin can be narrowed by bringing the external VBL input close to the supply voltage Vcc when data "1" is read out whereas it can be narrowed by bringing the external VBL input close to 0V when data "0" is read out so that memory cells inherently having narrow margins can be identified as defective memory cells.

The DRAM of FIG. 32 is same as that of FIG. 30 except that it employs a technique of controlling the memory cell capacitor plate potential VPL.

In FIG. 32, 151 denotes a capacitor plate potential line 151, 153 an internal VPL generating circuit, 154 a VPL switch pad, 155 an external VPL input pad and 156 an internal VPL.external VPL switch circuit. It is assumed here that the capacitance of the memory cell MC is equal to CS and the capacitance of each of the bit line pair (BL, /BL) is equal to CBL.

The VPL switch pad 154 and internal VPL.external VPL switch circuit 156 are designed to selectively supply the output (internal VPL) of the internal VPL generating circuit 153 or the input (external VPL) of the external VPL input pad 155 to the capacitor plate potential line 151.

When the VPL switch pad 154 is set to "L" level, the output of the internal VPL generating circuit 153 is transmitted to the capacitor plate potential line 151 by way of the CMOS switch 117.

When, on the other hand, the VPL switch pad 154 is set to "H" level, the input from the external VPL input pad 155 is transmitted to the capacitor plate potential line 151 by way of the CMOS switch 118.

The VPL switch pad 154 is connected to the Vss potential by way of a high resistance R and if a DRAM having a circuit as described above is sealed in a normal package without bonding the VPL switch pad 154 and the external VPL input pad 155, the output of the internal VPL generating circuit 153 is transmitted to the capacitor plate potential line 151 under the packaged condition.

If, on the other hand, the VPL switch pad 154 is set to "H" level at the time of the screening test, the input of the external VPL input pad 155 is transmitted to the capacitor plate potential line 151.

Figure 33:
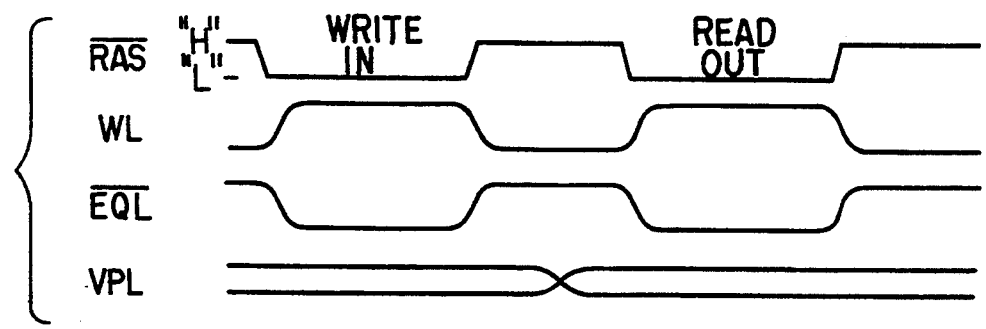
FIG. 33 is a graph showing timing waveforms of the DRAM of FIG. 32 typically obtained when it operates to read out data.

FIG. 33 is a graph showing waveforms of the circuit of FIG. 32 obtained when it operates to read out data.

Since equalize signal /EQL is at "H" level in a stand-by state, the bit line pair (BL, /BL) are connected to the bit line precharge potential VBL. Either data "0" data or "1" data is written in the memory cell MC in the preceding cycle of operation.

When data read-out operation is started, the word line WL is turned to "H" level and the data written in the memory cell MC is read out onto the bit line BL. Since the other bit line /BL of the bit line pair is not connected to the dummy cell, its potential is not changed after the data read out operation. Thus, the potential V/BL' of the bit line /BL will be expressed by the formula below after the data read-out operation.

$$V/BL' = VBL$$

On the other hand, it is assumed here that the capacitor plate potential VPL varies between the time of data write-in and that of data read-out, the capacitor plate potential at the time of data write-in being equal to VPLW, the capacitor plate potential at the time of data read-out being equal to VPLR. If the potential of the memory cell connected to the bit line BL under a stand by state is assumed to be VCELL, the value of VCELL will be equal to Vcc when data "1" is read-out and 0V when data "0" is read out. Then, the potential VBL' of the bit line BL after the data read-out operation will be expressed by the equation below because of the law of preservation of electric charge.

$$(VCELL - VPLW)CS + VBL.CBL = (VBL' - VPLR)CS + VBL'.CBL$$

Thus, the potential VBL' of the bit line BL after the data read out operation will be expressed by the equation below.

$$VBL' = \{VBL.CBL + CS(VCSLL - VPLW + VPLR)\}/(CBL + CS)$$

Since the sense margin is defined as the difference of the potentials of the bit line pair (BL, /BL), the following equation can be obtained.

$$V/BL' - VBL' = CS(VBL - VCELL + VPLW - VPLR)/(CBL + CS) \quad (3)$$

From the equation (3) above, it will be seen that the sense margin depends on the between the capacitor plate potential VPLW at the time of data write-in and the capacitor plate potential VPLR at the time of data read-out. In other words, the sense margin can be narrowed by making the capacitor plate potential VPLW low at the time of writing in "1" data and the capacitor plate potential VPLR high at the time of reading out "1" data or making the capacitor plate potential VPLW high at the time of writing in "0" data and the capacitor plate potential VPLR low at the time of reading out "0" data so that memory cells inherently having narrow margins can be identified as defective memory cells.

The screening test method of the invention can be applied not only to DRAMs, but also to, for example, memories of any other type.

The present invention is not limited to the embodiment described above with reference to the accompanying drawings. It can be modified within the scope of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   pairs of bit lines each including first and second bit lines;
   a plurality of memory cells connected to each pair of bit lines;
   a plurality of word lines for selecting the memory cells;
   first and second complementary dummy word lines;
   first capacitors, each connected between said first dummy word line and the first bit line of a respective one of said bit line pairs;
   second capacitors, each connected between said second dummy word line and the second bit line of said respective one of said bit line pairs; and
   a dummy word line potential control circuit including a dummy word line drive mode determining circuit for determining a dummy word line drive mode from a plurality of prearranged dummy word line drive modes and a dummy word line drive circuit for driving said dummy word lines in the dummy word line drive mode determined by said dummy word line drive mode determining circuit.

2. A semiconductor memory according to claim 1, wherein said dummy word line potential control circuit further controls the level of potential of said dummy word line as a function of a dummy word line level control potential.

3. A semiconductor memory according to claim 1, wherein said dummy word line potential control circuit operates to correct any unbalanced state existing between a "1" data read-out margin and a "0" data read-out margin of a selected memory cell.

4. A semiconductor memory according to claim 1, wherein a control potential for selecting a dummy word line drive mode out of a number of prearranged dummy word line drive modes is applied to said dummy word line potential control circuit to narrow a "1" data read-out margin or a "0" data read-out margin when said semiconductor memory is subjected to a screening test while it is still in wafer state.

5. A semiconductor memory according to claim 1, further comprising a pad formed on the memory chip where said dummy word line potential control circuit is formed, wherein a control potential for selecting a dummy word line drive mode out of a number of prearranged dummy word line drive modes is externally applied to said pad such that the dummy word line drive mode is determined in response to the control potential applied to said pad.

6. A semiconductor memory according to claim 2, wherein said dummy word line potential control circuit operates to correct any unbalanced state existing between a "1" data read-out margin and a "0" data read-out margin of a selected memory cell.

7. A semiconductor memory according to claim 3, further comprising a pad formed on the memory chip where said dummy word line potential control circuit is formed and connected to a given potential node so that a dummy word line drive mode is selected in response to a control potential applied to the pad.

8. A semiconductor memory according to claim 6, further comprising a pad formed on the memory chip where said dummy word line potential control circuit is formed and connected to a given potential mode so that a dummy word line drive mode is selected in response to a control potential applied to the pad.

9. A semiconductor memory according to claim 2, wherein a potential for selecting a dummy word line drive mode out of a number of prearranged dummy word line drive modes is applied to said dummy word line potential control circuit to narrow a "1" data read-out margin or a "0" data read-out margin when said semiconductor memory is subjected to a screening test while it is still in wafer state.

10. A semiconductor memory according to claim 2, further comprising a pad formed on the memory chip where said dummy word line potential control circuit is formed, wherein a control potential for selecting a dummy word line drive mode out of a number of prearranged dummy word line drive modes is externally applied to said pad such that the dummy word line drive mode is determined in response to the control potential applied to said pad.

11. A semiconductor memory according to claim 4, further comprising a pad formed on the memory chip where said dummy word line potential control circuit is formed, wherein said control potential for selecting a dummy word line drive mode out of a number of prearranged dummy word line modes is externally applied to said pad such that the dummy word line drive mode is determined in response to said control potential applied to said pad.

12. A semiconductor memory according to claim 9, further comprising a pad formed on the memory chip where said dummy word line potential control circuit is formed, wherein said potential for selecting a dummy word line drive mode out of a number of prearranged dummy word line drive modes is externally applied to said pad such that the dummy word line drive mode is determined in response to the control potential applied to said pad.

13. A semiconductor memory according to claim 1, wherein said dummy word line potential control circuit controls a change in potential of a selected dummy word line in accordance with a control potential for selecting a dummy word line drive mode from said plurality of prearranged dummy word line drive modes.

14. A semiconductor memory according to claim 1, wherein said dummy word line potential control circuit controls the direction of change in a potential of a selected dummy word line in accordance with a control potential for selecting a dummy word line drive mode from said plurality of prearranged dummy word line drive modes.

15. A semiconductor memory according to claim 13, wherein said dummy word line potential control circuit controls the direction of said change in the potential of the selected dummy word line in accordance with said control potential.

16. A semiconductor memory according to one of claims 13 through 4, wherein said dummy word line potential control circuit further controls the level of potential of said dummy word line as a function of a dummy word line level control potential.

17. A semiconductor memory according to any one of claims 13 to 4, wherein said dummy word line potential control circuit operates to correct any unbalanced state existing between a "1" data read-out margin and a "0" data read-out margin of a selected memory cell.

18. A semiconductor memory according to claim 16, wherein said dummy word line potential control circuit operates to correct any unbalanced state existing between a "1" data read-out margin and a "0" data read-out margin of a selected memory cell.

19. A semiconductor memory according to claim 17, wherein said dummy word line potential control circuit further comprises a pad formed on the memory chip where said dummy word line potential control circuit is formed and connected to a given potential node so that said dummy word line drive mode is selected in response to the control potential applied to the pad.

20. A semiconductor memory according to claim 7, wherein said dummy word line potential control circuit further comprises a pact formed on the memory chip where said dummy word line potential control circuit is formed and connected to a given potential mode so that said dummy word line drive mode is selected in response to the control potential applied to the pad.

21. A semiconductor memory according to any one of claims 13 to 4, wherein said control potential for selecting a dummy word line drive mode out of a number of prearranged dummy word line drive modes is applied to said dummy word line potential control circuit to narrow a "1" data read-out margin or a "0" data read-out margin when said semiconductor memory is subjected to a screening test while it is still in wafer state.

22. A semiconductor memory according to claim 16, wherein said control potential for selecting a dummy word line drive mode out of a number of prearranged dummy word line drive modes is applied to said dummy word line potential control circuit to narrow a "1" data read-out margin or a "0" data read-out margin when said semiconductor memory is subjected to a screening test while it is still in wafer state.

23. A semiconductor memory according to any one of claims 13 to 4, further comprising a pad formed on the memory chip where said dummy word line potential control circuit is formed, wherein said control potential for selecting a dummy word line drive mode out of a number of prearranged dummy word line drive modes is externally applied to said pad such that the dummy word line drive mode is determined in response to the control potential applied to said pad.

24. A semiconductor memory according to claim 16, further comprising a pad formed on the memory chip where said dummy word line potential control circuit is formed, wherein said control potential for selecting a dummy word line drive mode out of a number of prearranged dummy word line drive nodes is externally applied to said pad such that the dummy word line drive mode is determined in response to the control potential applied to said pad.

25. A semiconductor memory according to claim 10, further comprising a pad formed on the memory chip where said dummy word line potential control circuit is formed, wherein said control potential for selecting a dummy word line drive mode out of a number of prearranged dummy word line modes is externally applied to said pad such that the dummy word line drive mode is determined in response to the control potential applied to said pad.

26. A semiconductor memory according to claim 22, further comprising a pad formed on the memory chip where said dummy word line potential control circuit is formed, wherein said control potential for selecting a dummy word line drive mode out of a number of prearranged dummy word line drive modes is externally applied to said pad such that the dummy word line drive mode is determined in response to the control potential applied to said pad.

27. A semiconductor memory according to claim 1, wherein said first and second capacitors are dynamic-type memory cell capacitors each having a terminal connected to said related bit line by way of a MOS transistor to be used as a transfer gate.

28. A semiconductor memory according to claim 1, wherein said dummy word line potential control circuit is provided with a first selection feature of capable of either activating one of the dummy word lines or deactivating both of said dummy word lines when the selected word line is activated and a second selection feature of capable of selecting the one to be activated when either one of said dummy word lines is activated by said first selection feature.

29. A semiconductor memory according to claim 1, wherein said dummy word line potential control circuit is provided with a first selection feature of capable of either activating the two dummy word lines in opposite phases or keeping both of said two dummy word lines inactive when the selected word line is activated and a second selection feature of capable of inverting the phases of the two dummy word lines when said two dummy word liens are activated in opposite phase by means of said first section feature.

* * * * *